United States Patent
Nagato et al.

(10) Patent No.: US 9,976,214 B2
(45) Date of Patent: May 22, 2018

(54) CLEANING METHOD AND METHOD OF MANUFACTURING SEMICONDUCTOR DEVICE

(71) Applicant: HITACHI KOKUSAI ELECTRIC INC., Tokyo (JP)

(72) Inventors: Masaya Nagato, Toyama (JP); Koei Kuribayashi, Toyama (JP); Kenji Kameda, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days. days.

(21) Appl. No.: 15/434,796

(22) Filed: Feb. 16, 2017

(65) Prior Publication Data
US 2017/0260626 A1 Sep. 14, 2017

(30) Foreign Application Priority Data
Mar. 14, 2016 (JP) ................................ 2016-049531

(51) Int. Cl.
C23C 16/44 (2006.01)
C23C 16/40 (2006.01)
C23C 16/455 (2006.01)
H01L 21/02 (2006.01)

(52) U.S. Cl.
CPC ........ *C23C 16/4405* (2013.01); *C23C 16/401* (2013.01); *C23C 16/4408* (2013.01); *C23C 16/45527* (2013.01); *H01L 21/0228* (2013.01); *H01L 21/02164* (2013.01)

(58) Field of Classification Search
CPC ............ C23C 16/4405; C23C 16/4408; C23C 16/401; C23C 16/45527; H01L 21/02164; H01L 21/0228

USPC ......................................................... 438/758
See application file for complete search history.

(56) References Cited

U.S. PATENT DOCUMENTS

| 5,609,721 A * | 3/1997 | Tsukune ............. C23C 16/4405 134/22.11 |
| 7,520,937 B2 * | 4/2009 | Hasebe ................. B08B 7/0035 118/715 |
| 2006/0068598 A1 * | 3/2006 | Okada ................. C23C 16/4404 438/758 |

(Continued)

FOREIGN PATENT DOCUMENTS

| JP | 2005-277302 A | 10/2005 |
| JP | 2005-317920 A | 11/2005 |

(Continued)

*Primary Examiner* — Fernando L Toledo
*Assistant Examiner* — Adam S Bowen
(74) *Attorney, Agent, or Firm* — Volpe and Koenig, P.C.

(57) ABSTRACT

A technique for improving cleaning efficiency after a film forming process is performed is provided. Provided is a method of cleaning a processing chamber after a formation of a film on a substrate, the method including: (a) supplying a gas containing hydrogen and fluorine into the processing chamber heated to a first temperature; (b) elevating an inner temperature of the processing chamber to a second temperature higher than the first temperature; and (c) supplying a gas containing fluorine into the processing chamber heated to the second temperature, wherein the first temperature is a temperature whereat the gas containing fluorine is not activated, and the second temperature is a temperature whereat the gas containing fluorine is activated.

17 Claims, 13 Drawing Sheets

(56) References Cited

U.S. PATENT DOCUMENTS

| | | | |
|---|---|---|---|
| 2006/0081182 A1* | 4/2006 | Okada | C23C 16/4405 118/715 |
| 2007/0117398 A1* | 5/2007 | Okada | C23C 16/4405 438/710 |
| 2015/0031216 A1 | 1/2015 | Akae et al. | |
| 2015/0232986 A1 | 8/2015 | Kameda et al. | |

FOREIGN PATENT DOCUMENTS

| | | |
|---|---|---|
| JP | 2008-078285 A | 4/2008 |
| JP | 2015-026660 A | 2/2015 |
| JP | 2015-153956 A | 8/2015 |

\* cited by examiner

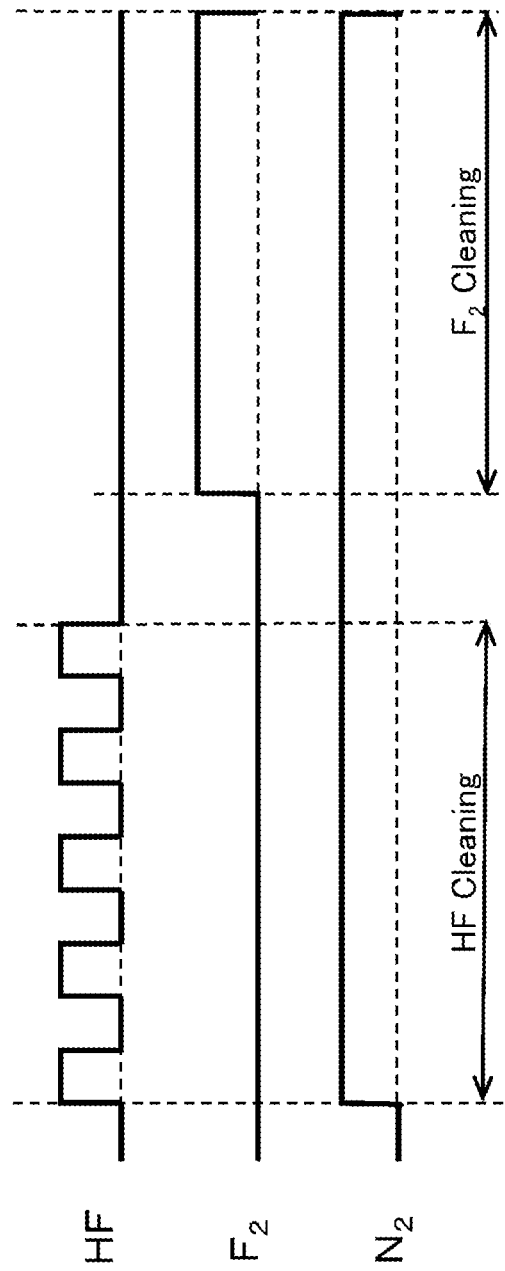

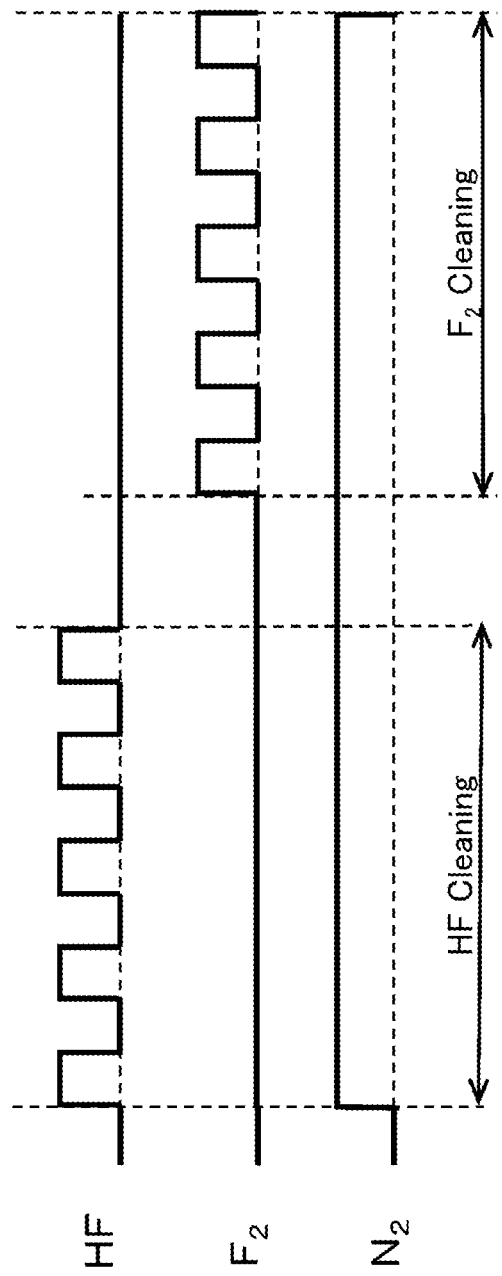

US 9,976,214 B2

1

CLEANING METHOD AND METHOD OF MANUFACTURING SEMICONDUCTOR DEVICE

CROSS-REFERENCE TO RELATED PATENT APPLICATION

This non-provisional U.S. patent application claims priority under 35 U.S.C. § 119 of Japanese Patent Application No. 2016-049531, filed on Mar. 14, 2016, the entire contents of which are hereby incorporated by reference.

BACKGROUND

1. Field

The present disclosure relates to a cleaning method and a method of manufacturing a semiconductor device.

2. Description of the Related Art

A film forming process for forming a film on a substrate accommodated in a processing chamber is performed as a manufacturing process of a semiconductor device. When the film forming process is performed, deposits are adhered to the processing chamber. Thus, a cleaning process may be performed to remove the deposit adhered to the processing chamber by supplying a cleaning gas into the processing chamber after the film forming process is performed.

SUMMARY

Described herein is a technique capable of improving cleaning efficiency after the film forming process is performed.

According to one aspect of the technique described herein, there is provided a method of cleaning a processing chamber after a formation of a film on a substrate, the method including: (a) supplying a gas containing hydrogen and fluorine into the processing chamber heated to a first temperature; (b) elevating an inner temperature of the processing chamber to a second temperature higher than the first temperature; and (c) supplying a gas containing fluorine into the processing chamber heated to the second temperature, wherein the first temperature is a temperature whereat the gas containing fluorine is not activated, and the second temperature is a temperature whereat the gas containing fluorine is activated.

Figure 6B:
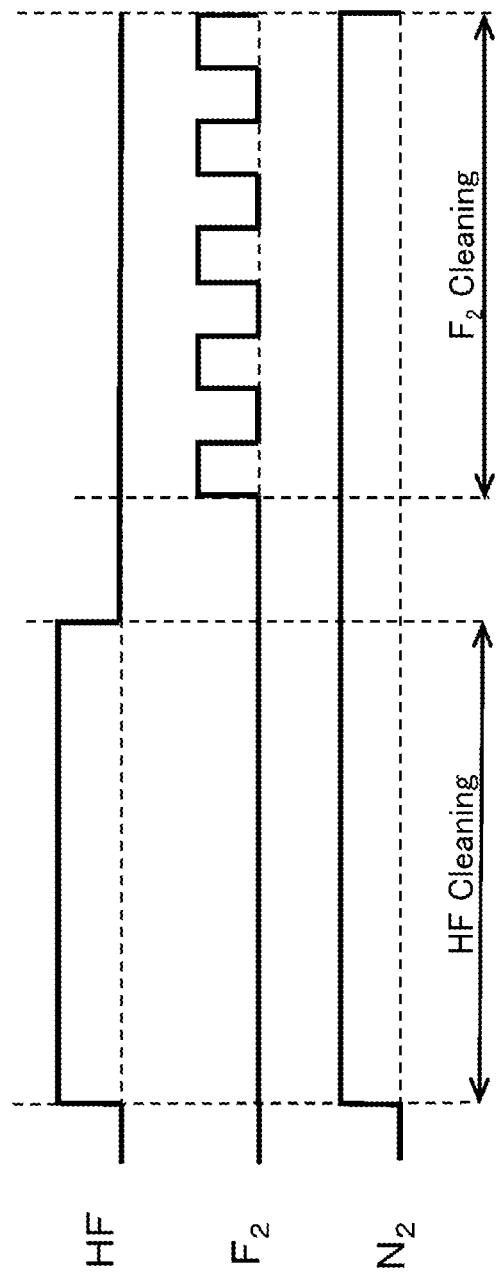
FIG. 6B illustrates a second modified example of gas supply timing in the cleaning process according to the embodiment described herein, FIG. 6C
Figure 6D:
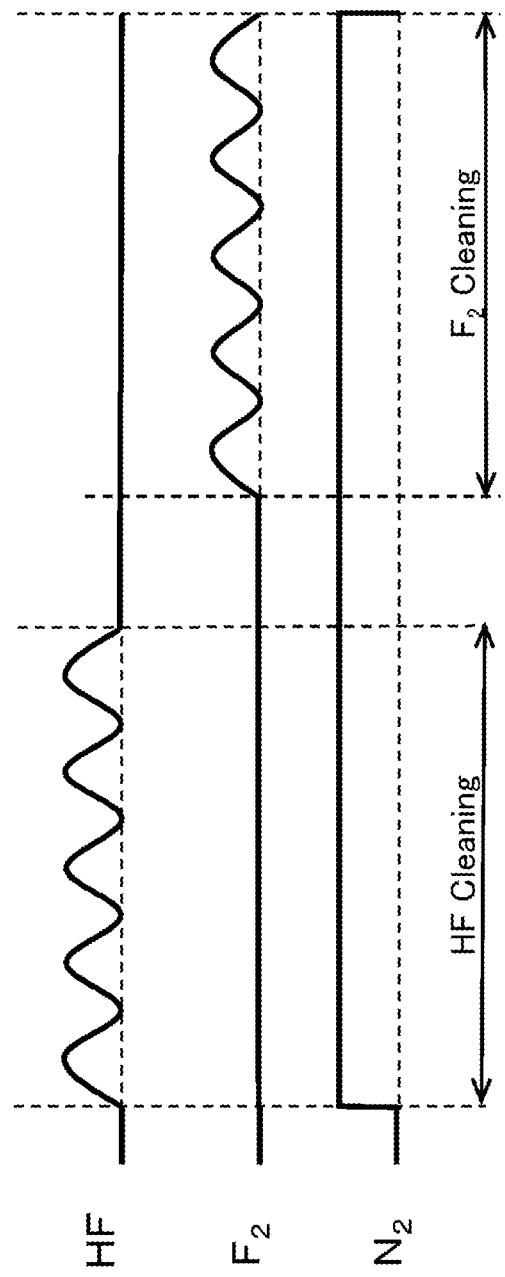
FIG. 6A illustrates a first modified example of a gas supply timing in a cleaning process according to the embodiment described herein.

2 illustrates a third modified example of the gas supply timing in the cleaning process according to the embodiment described herein, and FIG. 6D illustrates a fourth modified example of the gas supply timing in the cleaning process according to the embodiment described herein.

Figure 7A:
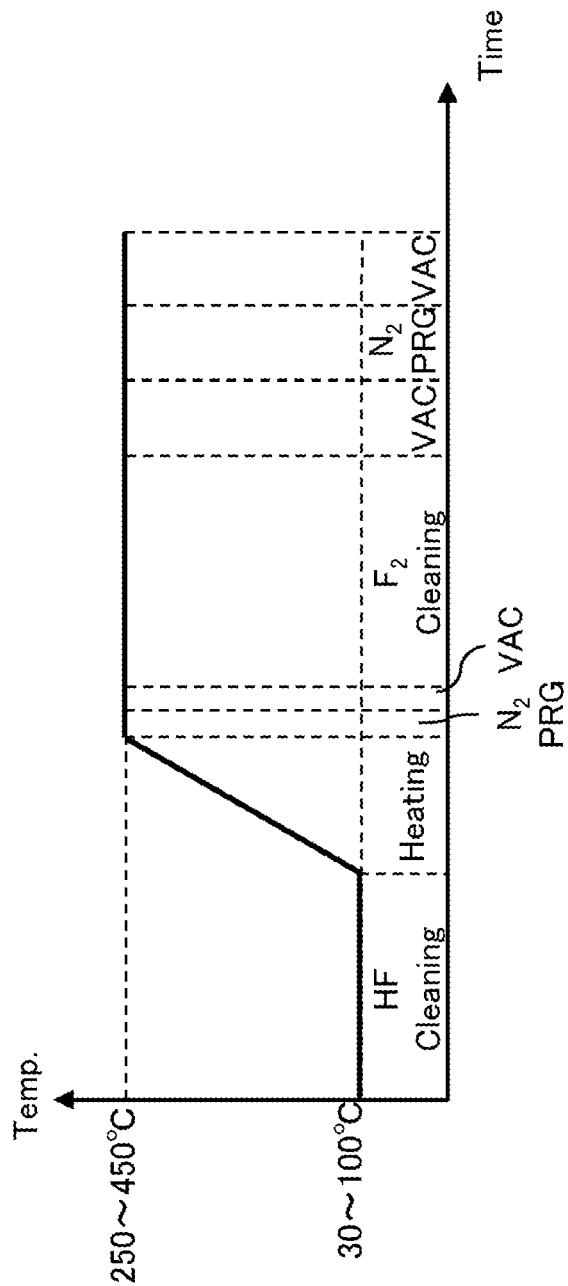
Figure 7B:
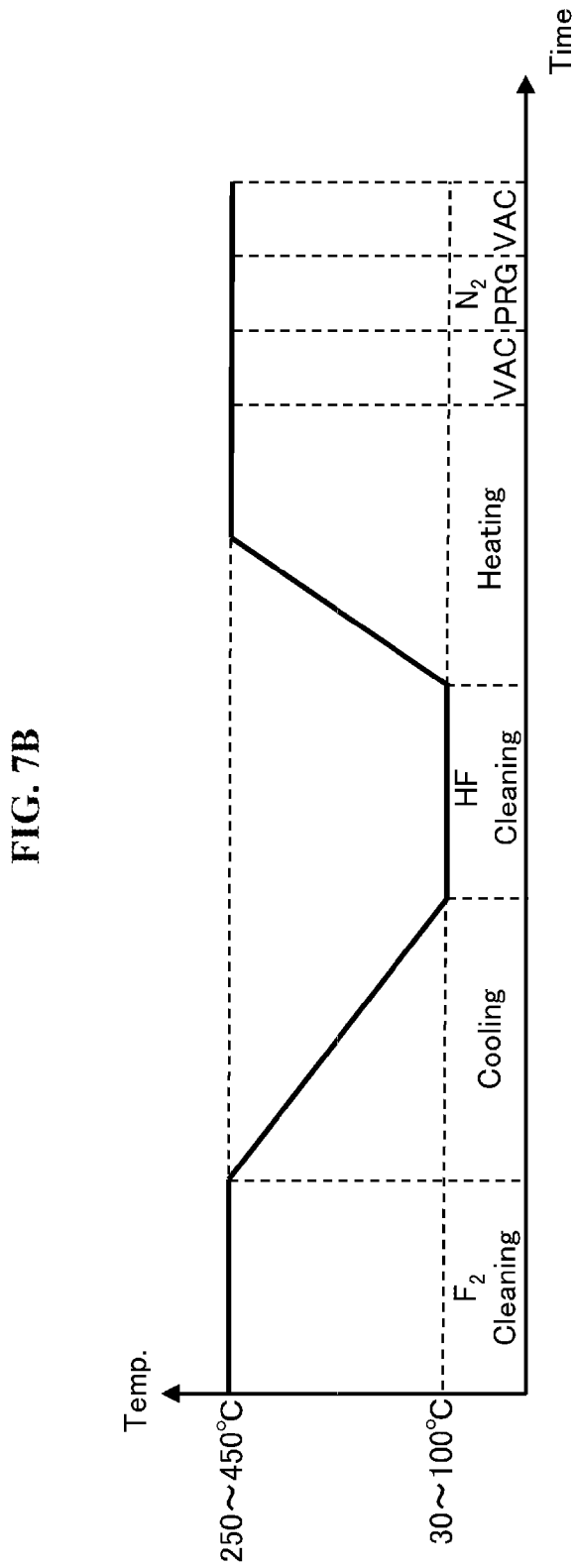

FIG. 7A illustrates the progress of cleaning and purge of the processing chamber according to an example, and FIG. 7B illustrates the progress of cleaning and purge of the processing chamber according to a comparative example.

Figure 8A:
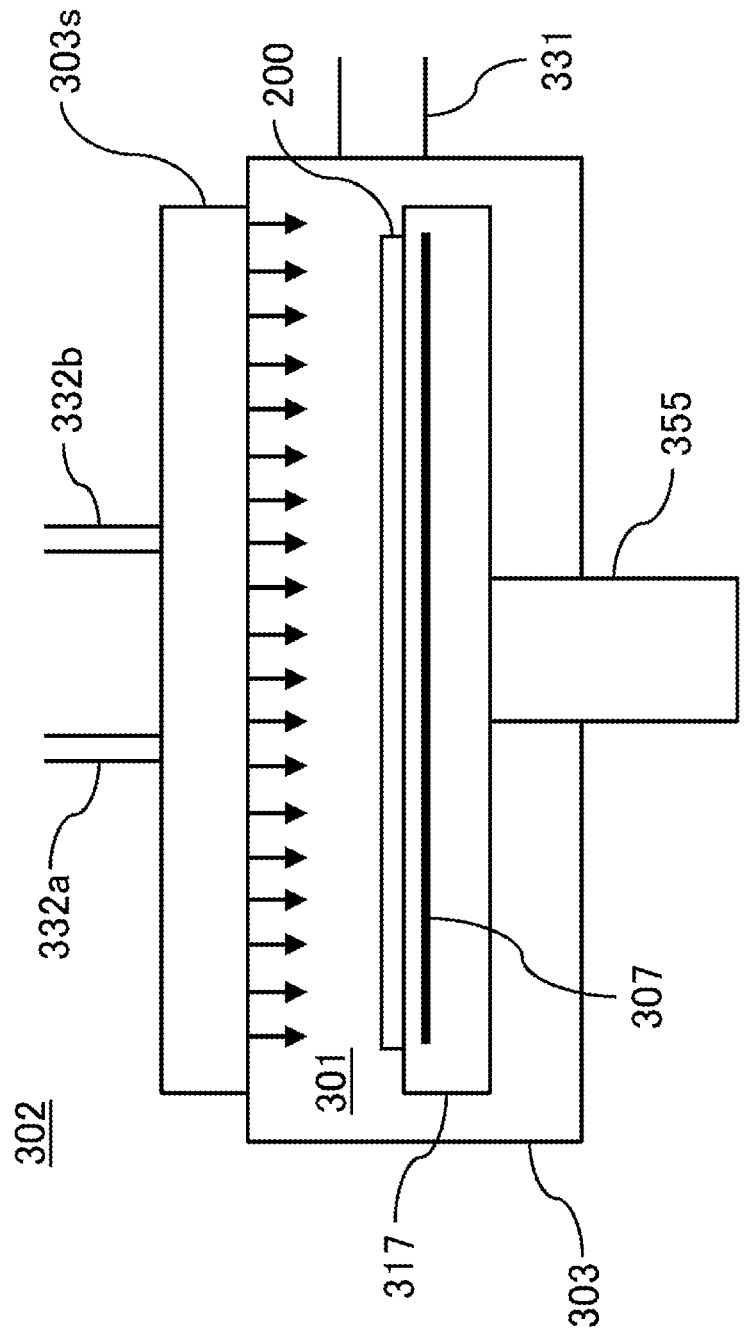
Figure 8B:
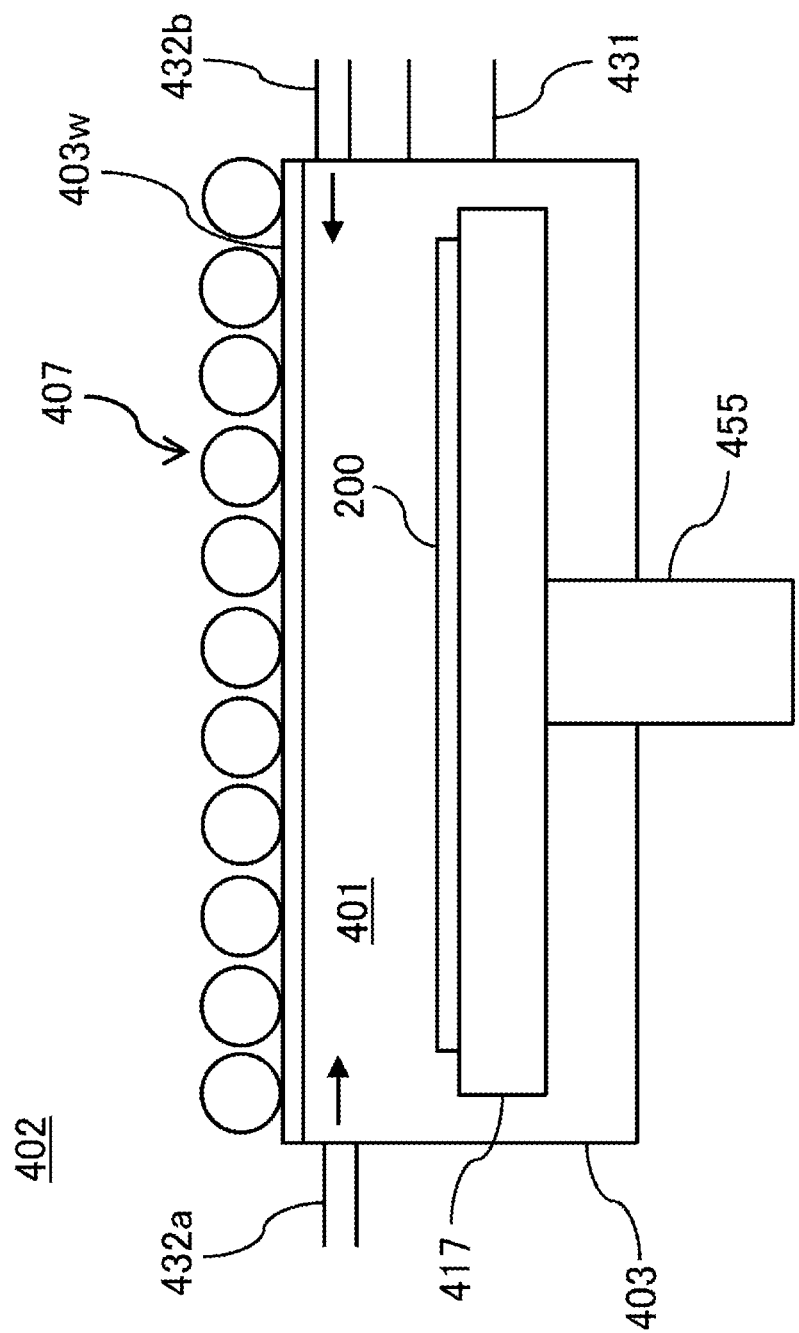

FIG. 8A schematically illustrates a longitudinal cross-section of a vertical processing furnace of a substrate processing apparatus preferably used in another embodiment described herein, and FIG. 8B is a longitudinal cross-section of a vertical processing furnace of a substrate processing apparatus preferably used in yet another embodiment described herein.

DETAILED DESCRIPTION

Embodiment

Hereinafter, an embodiment will be described with reference to FIGS. 1 through 3.

(1) Configuration of Substrate Processing Apparatus

Figure 1:
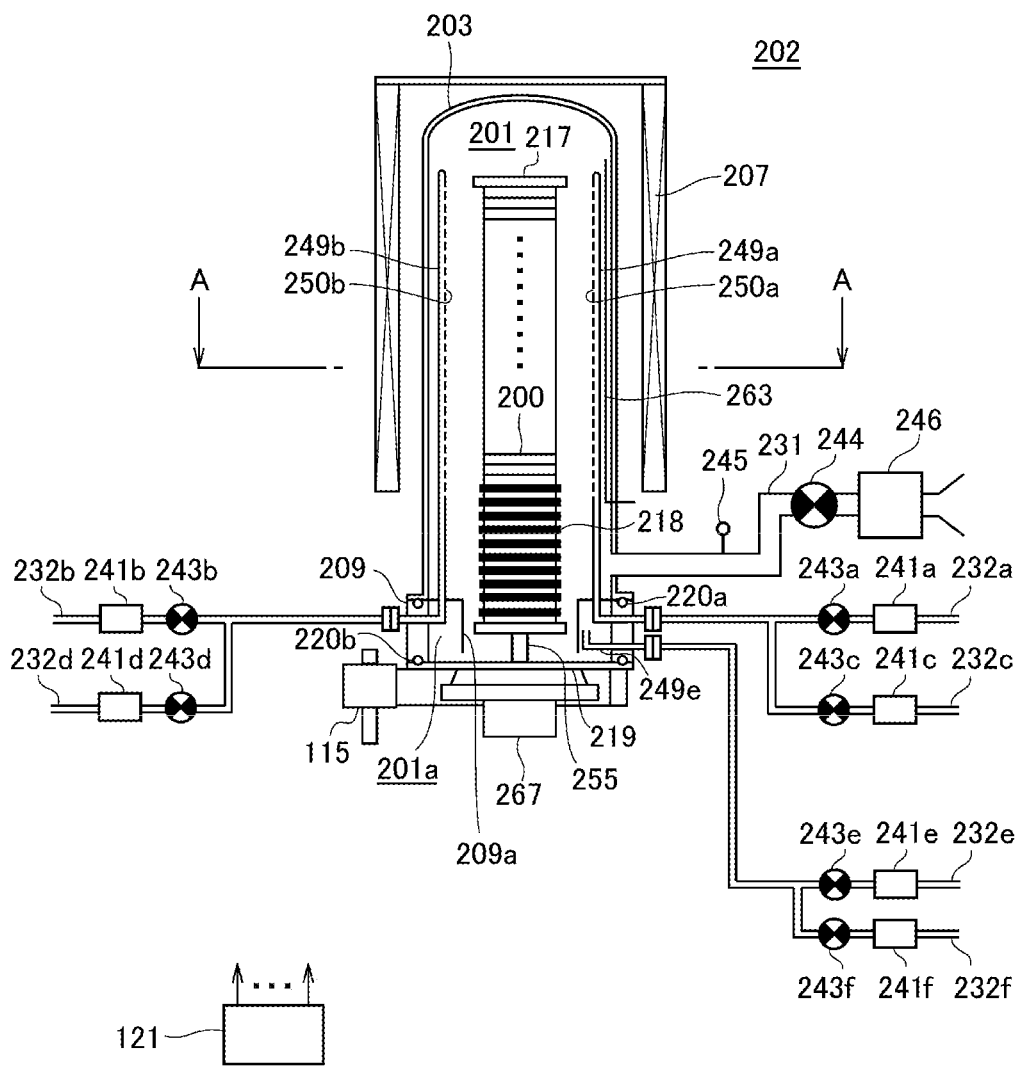
FIG. 1 schematically illustrates a vertical processing furnace of a substrate processing apparatus preferably used in embodiments described herein.

As shown in FIG. 1, the processing furnace 202 includes a heater 207 which is a heating means (heating mechanism). The heater 207 is cylindrical and supported by a support plate (not shown) and installed vertically. The heater 207 also functions as an excitation unit that thermally activates (excites) the gas.

The reaction tube 203 is installed concentrically with the heater 207 inside the heater 207. The reaction tube 203 is made of a heat-resistant material such as quartz ($SiO_2$) and silicon carbide (SiC), has a cylindrical shape with a closed upper end and open lower end. The manifold 209 is installed concentrically with the reaction tube 203 below the reaction tube 203. The manifold 209 is made of a metal such as stainless steel (SUS), and has a cylindrical shape with open upper and lower ends. The upper end of the manifold 209 is engaged with the lower end of the reaction tube 203 to support the reaction tube 203. An O-ring 220a, which is a sealing member, is installed between the manifold 209 and the reaction tube 203. The reaction tube 203 is installed vertically in the same manner as the heater 207. The processing vessel (reaction vessel) is constituted by a reaction tube 203 and a manifold 209. The processing chamber 201 is provided in a cylindrical hollow portion of the processing vessel. The processing chamber 201 also includes the inner wall of the processing vessel. The processing chamber 201 is configured to accommodate a plurality of substrates, that is, wafers 200. The cover 209a is installed on the inner wall of the manifold 209. The cover 209a is made of a material such as quartz and silicon carbide (SiC) and is installed to cover the inner wall of the manifold 209 along the inner wall of the manifold 209.

The nozzles 249a, 249b and 249e are installed to pass through the manifold 209 into the processing chamber 201. The nozzles 249a, 249b and 249e are made of a heat resistant material such as quartz and silicon carbide (SiC). The gas supply pipes 232a, 232b and 232e are connected to the nozzles 249a, 249b and 249e, respectively.

Mass flow controllers 241a, 241b and 241e (MFC), which are flow rate controllers (flow rate control units), and valves 243a, 243b and 243e, which are on/off valves, are respectively installed at the gas supply pipes 232a, 232b and 232e from the upstream side to the downstream side of the gas supply pipes 232a, 232b and 232e. Gas supply pipes 232c, 232d and 232f configured to supply an inert gas are connected to gas supply pipes 232a, 232b and 232e at the downstream side of the valves 243a, 243b and 243e, respectively. The MFCs 241c, 241d and 241f and the valves 243c, 243d and 243f are respectively installed in the gas supply pipes 232c, 232d and 232f from the upstream side to the downstream side of the gas supply pipes 232c, 232d and 232f.

Figure 2:
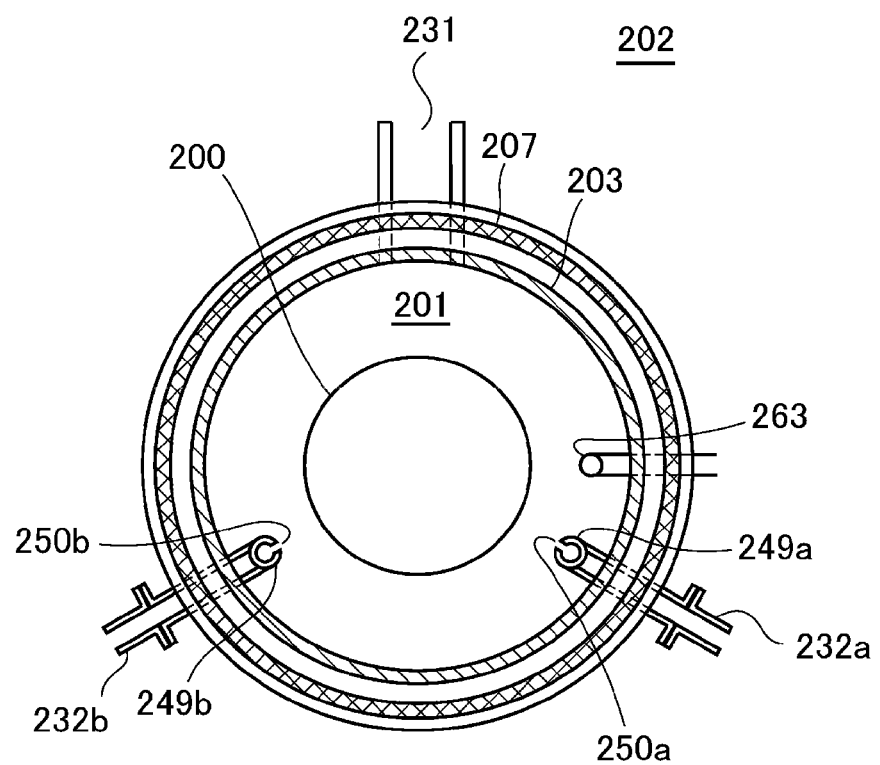
FIG. 2 is a cross-sectional view taken along line A-A of FIG. 1 of a portion of the vertical processing furnace of the substrate processing apparatus preferably used in the embodiments described herein.

As shown in FIG. 2, the nozzles 249a and 249b are vertically installed a ring-shaped space defined by the inner wall of the reaction tube 203 and the wafers 200 along the stacking direction of the wafers 200 from the lower portion to the upper portion of the inner wall. That is, each of the nozzles 249a and 249b is provided in a region at the side of the wafer arrangement region where the wafers 200 are arranged along the wafer arrangement region. A plurality of gas supply ports 250a and 250b configured to supply gas are provided on the sides of the nozzles 249a and 249b, respectively. The gas supply ports 250a and 250b are open toward the center of the reaction tube 203 and supply the gas toward the wafers 200. The gas supply ports 250a, 250b are provided from the bottom to the top of the reaction tube 203.

As shown in FIG. 1, a nozzle 249e is disposed within a ring-shaped space 201a (hereinafter referred to as "purge space") defined by the inner wall of the manifold 209 and the cover 209a to inject gas into the ring-shaped space 201a. A gas supply port is opened upward at the tip of the nozzle 249e. Gas supply ports may be provided on the side of the tip of the nozzle 249e to open in horizontal direction. The nozzle 249e is a short nozzle.

As a process gas (source gas), for example, a gas containing silicon which is a predetermined element (main element) and a halogen element, i.e. a halosilane source gas is supplied into processing chamber 201 through the MFC 241a and the valve 243a, installed at a gas supply pipe 232a and the nozzle 249a.

The source gas refers to a precursor such as a gaseous precursor, a gas obtained by vaporizing a precursor in a liquid state under normal temperature and normal pressure, and a gaseous precursor under normal temperature and normal pressure. Halosilane precursor refers to a precursor containing a halogen group. The halogen group includes a chloro group, a fluoro group, a bromo group and an iodo group. That is, halogen elements such as chlorine (Cl), fluorine (F), bromine (Br) and iodine (I) are included in the halogen group.

For example, a halosilane source gas containing silicon and chlorine, i.e. a chlorosilane source gas, may be used as the source gas. For example, hexachlorodisilane ($Si_2Cl_6$, abbreviated as HCDS) gas may be used as a chlorosilane source gas.

For example, a gas containing oxygen is supplied into the processing chamber 201 as the process gas via the MFC 241b and the valve 243b provided in the gas supply pipe 232b and the nozzle 249b. The gas containing oxygen acts as an oxidizing gas, i.e., an oxygen source in the film forming process described below. For example, oxygen ($O_2$) gas may be used as an oxidizing gas.

For example, a hydrogen-containing gas is supplied into the processing chamber 201 as a process gas via the MFC 241a and a valve 243a provided in the gas supply pipe 232a and a nozzle 249a. Hydrogen-containing gas does not perform oxidation by itself but reacts with a gas containing oxygen under specific conditions of a film forming process to generate oxidizing species such as atomic oxygen, thereby improving the efficiency of the oxidation process. Thus, a hydrogen-containing gas may be regarded as an oxidizing gas as well as the gas containing oxygen. For example, hydrogen ($H_2$) gas may be used as a hydrogen-containing gas.

A first cleaning gas, for example, a hydrogen/fluorine-containing gas (a fluorine-based gas containing hydrogen) is supplied into the processing chamber 201 via the MFCs 241a and 241b and the valves 243a and 243b provided in the gas supply pipes 232a and 232b and the nozzles 249a and 249b. The first cleaning gas, for example, the hydrogen/fluorine-containing gas is supplied to the purge space 201a inside the cover 209a via the MFC 241e and the valve 243e provided in the gas supply pipes 232e and the nozzle 249e. For example, hydrogen fluoride (HF) gas may be used as the hydrogen/fluorine-containing gas.

For example, a gas containing fluorine, which a second cleaning gas, is supplied into the processing chamber 201 via the MFCs 241a and 241b and the valves 243a and 243b provided in the gas supply pipes 232a and 232b and the nozzles 249a and 249b. The gas containing fluorine which is the second cleaning gas such is supplied into the purge space 201a via the MFC 241e and the valve 243e provided in the gas supply pipes 232e and the nozzle 249e. For example, fluorine ($F_2$) gas may be used as the gas containing fluorine.

An inert gas such as nitrogen ($N_2$) gas is supplied is supplied into the processing chamber 201 via the MFCs 241c, 241d and 241f and the valves 243c, 243d and 243f provided in the gas supply pipes 232c, 232d and 232f and the gas supply pipes 232a, 232b and 232e, and the nozzles 249a, 249b and 249e.

The source gas supply system includes the gas supply pipe 232a, the MFC 241a, and the valve 243a. The oxidizing gas supply system includes the gas supply pipe 232b, the MFC 241b, and the valve 243b. The hydrogen-containing gas supply system includes the gas supply pipe 232a, the MFC 241a, and the valve 243a. The oxidizing gas supply system may further include a hydrogen-containing gas supply system. The hydrogen/fluorine-containing gas supply system includes the gas supply pipes 232a, 232b and 232e, the MFCs 241a, 241b and 241e and the valves 243a, 243b and 243e. The fluorine-containing gas supply system includes the gas supply pipes 232a, 232b and 232e, the MFCs 241a, 241b and 241e and the valves 243a, 243b and 243e. The inert gas supply system includes the gas supply pipes 232c, 232d and 232f, The MFCs 241c, 241d and 241f and the valves 243c, 243d and 243f.

One of or all of the gas supply systems described above may be embodied by an integrated gas supply system 248 in which components such as the valves 243a through 243f and the MFCs 241a through 241f are integrated. The integrated gas supply system 248 is connected to each of the gas supply pipes 232a through 232f and is operated to supply various gases into the gas supply pipes 232a through 232f, that is, to open and close the valves 243a through 243f, and adjust the flow rate by the flow rate controllers 241a to 241f under the control of the controller 121 to be described later. The integrated gas supply system 248 may be embodied as an integrated or discrete unit and may be detached from components such as gas supply pipes 232a through 232f and maintained such that maintenance, exchange, expansion and management of the gas supply system may be performed by units.

An exhaust pipe 231 for exhausting an inner atmosphere of the processing chamber 201 is installed in the reaction tube 203. The vacuum pump 246 serving as a vacuum exhaust device is connected to the exhaust pipe 231 via a pressure sensor 245 serving as a pressure detector for detecting the inner pressure of the processing chamber 201 and an APC valve 244 serving as a pressure controller. The APC valve 244 may be opened and closed while operating the vacuum pump 246 such that the processing chamber 201 may be vacuum-exhausted or the vacuum-exhaust may be stopped. The degree of opening of the APC valve 244 may be adjusted to adjust the inner pressure of the processing chamber 201 based on the pressure information detected by the pressure sensor 245 while the vacuum pump 246 is operated. The exhaust system includes the exhaust pipe 231, the APC valve 244, and the pressure sensor 245. The exhaust system may further include a vacuum pump 246.

A seal cap 219, which is a cover of a furnace opening, is installed under the manifold 209 and may close the opening at the bottom of the manifold 209 in air-tight manner. The seal cap 219 is made of a metal such as SUS and has a disk shape. The O-ring 220b, which is a sealing member, is installed on the upper surface of the seal cap 219 so as to be in contact with the lower end of the manifold 209. A rotating mechanism 267 for rotating a boat 217, which will be described later, is installed below the seal cap 219. The rotation shaft 255 of the rotating mechanism 267 is connected to the boat 217 through the seal cap 219. The rotating mechanism 267 is configured to rotate the wafer 200 by rotating the boat 217. The seal cap 219 is configured to be vertically elevated by a boat elevator 115, which is an elevating mechanism provided outside the reaction tube 203. The boat elevator 115 is configured to carry the boat 217 into or out of the processing chamber 201 by moving the seal cap 219 up and down. The boat elevator 115 serves as a transfer device (transfer mechanism) for transporting the boat 217, i.e., the wafers 200, into or out of the processing chamber 201. A shutter (not shown), which is a cover of the furnace opening, is installed under the manifold 209. The shutter (not shown) may seal the opening at the bottom of the manifold 209 in air-tight manner while the seal cap 219 is lowered by the boat elevator 115. The shutter (not shown) is made of a metal such as SUS and has a disc shape. An O-ring (not shown), which is a sealing member, is installed on the upper surface of the shutter (not shown) so as to be in contact with the lower end of the manifold 209. An operation of opening and closing the shutter (not shown) such as moving up and down and rotating the shutter (not shown) is controlled by a shutter opening/closing mechanism 115s.

The boat 217, which is a substrate retainer, is configured to vertically support a plurality of the wafers 200, for example 25 to 200 wafers, in a horizontal orientation, concentrically and in multiple stages with spaces therebetween. The boat 217 is made of a heat resistant material such as quartz and silicon carbide (SiC). An insulating plate 218 made of a heat resistant material such as quartz and silicon carbide (SiC) is supported in a horizontal orientation below the boat 217 in a multistage manner. The heat insulating plate 218 suppresses the heat from the heater 207 from being transmitted to the seal cap 219. A heat insulating cylinder which is a cylindrical member made of a heat resistant material such as quartz and silicon carbide (SiC) may be installed at the lower part of the boat 217 instead of the insulating plate 218.

A temperature sensor 263, which is a temperature detector, is installed in the reaction tube 203. The inner temperature of the processing chamber 201 may be controlled to follow a desired temperature distribution by adjusting the energization state of the heater 207 based on the temperature detected by the temperature sensor 263. The temperature sensor 263 is installed along the inner wall of the reaction tube 203.

Figure 3:
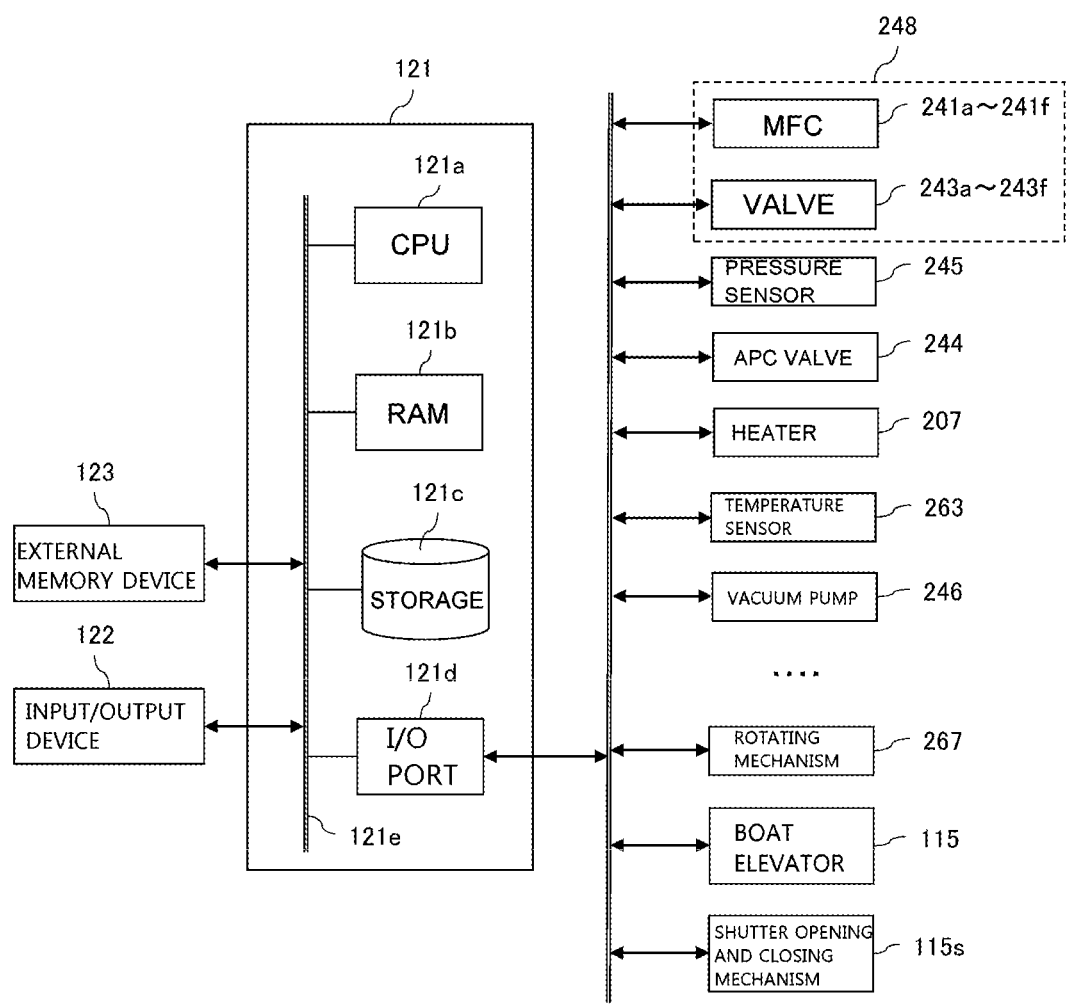
FIG. 3 schematically illustrates a control system of a controller of the substrate processing apparatus used in the embodiments described herein.

As shown in FIG. 3, the controller 121, which is a control unit (control means), includes a central processing unit (CPU) 121a, a random access memory (RAM) 121b, a storage 121c and an I/O port 121d. The RAM 121b, the memory device 121c and the I/O port 121d may exchange data with the CPU 121a via an internal bus 121e. An input/output device 122 such as a touch panel is connected to the controller 121.

The memory device 121c is embodied by, for example, a flash memory or a hard disk drive (HDD). Data such control program for controlling the operations of the substrate processing apparatus, a process recipe containing information such as the sequence and the condition of substrate processing to be described later and a cleaning recipe containing information such as the sequence and the condition of a cleaning process is readably stored in the memory device 121c. The process recipe, which functions as a program, is created for the controller 121 to execute each step of the film forming process to be described later to obtain a predetermined result. The cleaning recipe, which functions as a program, is created for the controller 121 to execute each step of the cleaning process described later to obtain a predetermined result. Hereinafter, the process recipe, the cleaning recipe, the control program and the like may be collectively referred to simply as a program. The process recipe and the cleaning recipe may be collectively referred to simply as a recipe. Hereinafter, the program may refer to only the recipe, only the control program, or any combination of the process recipe, the cleaning recipe and the control program. The RAM 121b functions as a memory area in which programs or data read by the CPU 121a are temporarily stored.

The I/O port 121d is connected to components such as the MFCs 241a to 241f, the valves 243a to 243f, the pressure sensor 245, the APC valve 244, the vacuum pump 246, the heater 207, the temperature sensor 263, the rotating mechanism 267, the boat elevator 115 and the shutter opening and closing mechanism 115s.

The CPU 121a is configured to read and execute the control program from the memory device 121c and to read the recipe from the memory device 121c in accordance with an instruction such as input of an operation command from the input/output device 122. The CPU 121a controls various gas flow rate adjustment operations by the MFCs 241a through 241f, opening and closing operations of the valves 243a through 243f, operation of the APC valve 244, The opening and closing operation and the pressure adjusting operation by the APC valve 244 based on the pressure sensor 245, the start and stop operation of the vacuum pump 246, the temperature adjusting operation of the heater 207 based on the temperature sensor 263, The operation of adjusting the rotation and rotation speed of the boat 217 by the rotating mechanism 267, the operation of raising and lowering the boat 217 by the boat elevator 115 and the opening and closing operations of the shutter (not shown) by the shutter opening and closing mechanism 115s.

The controller 121 may be embodied by installing the program stored in an external memory device 123 (for example, a magnetic disk such as a hard disk, an optical disk such as a CD and a DVD, a magneto-optical disk such as an MO, and a semiconductor memory such as USB memory) on the computer. The memory device 121c or the external memory device 123 may be embodied by a computer-readable recording medium. Hereinafter, the memory device 121c and the external memory device 123 are collectively referred to simply as a recording medium. Recording medium hereinafter refers to only the memory device 121c, only the external memory device 123 or both. When a program is provided to a computer, communication means such as the Internet and a dedicated communication line may be used instead of the external memory device 123.

(2) Film Forming Process

Next, an example of a sequence of forming a film on a substrate, which is one of manufacturing processes of a semiconductor device, using the substrate processing apparatus will be described with reference to FIG. 4. Hereinafter, the controller 121 controls the operation of each component constituting the substrate processing apparatus.

Figure 4:
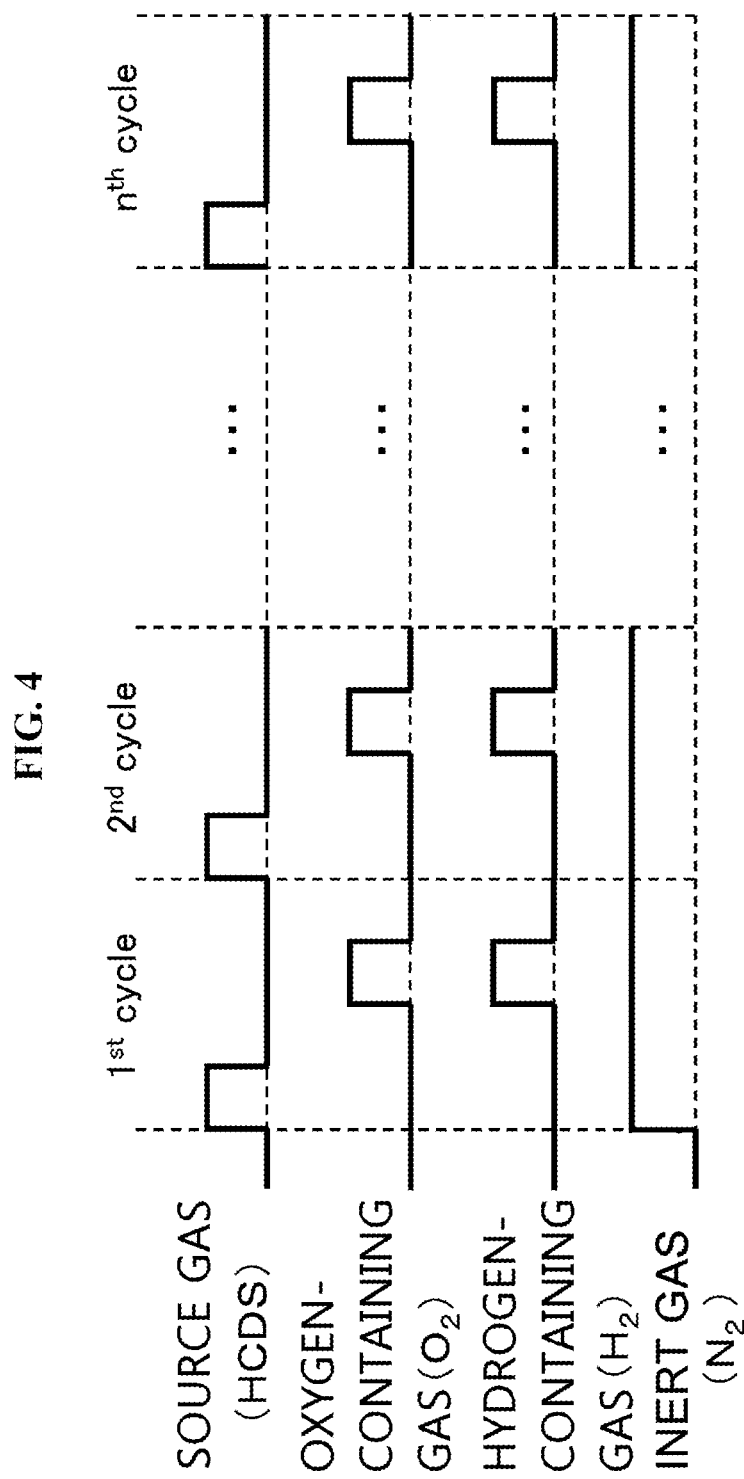
FIG. 4 illustrates a gas supply timing in the film forming process of an embodiment described herein.

A cycle, which is the film forming sequence shown in FIG. 4, is performed a predetermined number of times (n times or more) to form a silicon oxide film (SiO$_2$ film, hereinafter simply referred to as SiO film) on the wafer 200, which is a film containing oxygen (O). The cycle includes non-simultaneously (asynchronously) performing step 1 for supplying HCDS gas as a source gas to the wafer 200 accommodated in a processing vessel (processing chamber 201) and step 2 of supplying O$_2$ gas as a gas containing oxygen and H$_2$ gas as a hydrogen-containing gas into the processing vessel having heated atmosphere under sub atmospheric pressure.

In the present disclosure, the film forming process described above may be represented as follows. The same notation may be used in the description of other embodiments below.

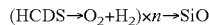

(HCDS→O$_2$+H$_2$)×n→SiO

In the present disclosure, the term "wafer" refers to "wafer itself" or "wafer having stacked structure of a predetermined layer, film, etc. formed thereon" (wafer itself as well as the layers and film formed thereon). In the present disclosure, the term "surface of wafer" refers to "surface of wafer itself" (exposed surface) or "the surfaces of the layers and films formed on the wafer", i.e. "the top surface of the stacked structure formed on the wafer".

Thus, in the present specification, "supplying a gas to a wafer" refers to "supplying a gas directly to the surface of the wafer itself" or "the surfaces of the layers and films formed on the wafer", i.e. "supplying a gas to the top surface of the stacked structure formed on the wafer". In the present disclosure, "forming a layer (or film) on a wafer" refers to "forming a layer (or film) directly on the surface of the wafer itself" or "forming a layer (or film) on the surfaces of the layers and films formed on the wafer", i.e. "forming a layer (or film) on the top surface of the stacked structure formed on the wafer".

In the present disclosure, the term "substrate" has the same meaning as the term "wafer".

<Wafer Charging Step and Boat Loading Step>

When the wafers 200 are loaded on the boat 217 (wafer charging step), the opening of the lower end of the manifold 209 is opened by moving the shutter (not shown) by the shutter opening/closing mechanism 115s (shutter opening step). Thereafter, as shown in FIG. 1, the boat 217 having the wafers 200 loaded is lifted by the boat elevator 115 and is loaded into the processing chamber 201 (boat loading step). The seal cap 219 seals the lower end of the manifold 209 via the O-ring 220b with the boat 217 loaded in the processing chamber 201.

<Pressure Adjusting Step and Temperature Adjusting Step>

The processing chamber 201 is vacuum-exhausted by vacuum pump 246 until the inner pressure of the processing chamber 201, i.e. the inner pressure of the space where the wafer 200 is placed reaches a desired pressure (at vacuum level). At this time, the inner pressure of the processing chamber 201 is measured by the pressure sensor 245, and the APC valve 244 is feedback-controlled based on the measured pressure (pressure adjusting step). The vacuum pump 246 continues to operate at least until the processing for the wafers 200 is completed. The processing chamber 201 is heated by the heater 207 until the inner temperature of the processing chamber 201 reaches a desired film forming temperature. At this time, the amount of current supplied to the heater 207 is feedback-controlled (temperature adjusting step) based on the temperature by the temperature sensor 263 until the distribution of the inner temperature of the processing chamber 201 reaches a desired temperature distribution. The heater 207 continues to heat the processing chamber 201 until the processing for the wafers 200 is completed. The rotation of the boat 217 and the wafers 200 is then started by the rotating mechanism 267. The rotating mechanism 267 continues to rotate the boat 217 and the wafers 200 until the processing for the wafers 200 is completed.

<Film Forming Step>

Next, the steps 1 and 2 are sequentially executed.

<Step 1>

In the step 1, HCDS gas is supplied to the wafer 200 in the processing chamber 201. The HCDS gas is supplied into the gas supply pipe 232a by opening the valve 243a. The HCDS gas having the flow rate thereof adjusted by the MFC 241a is supplied to the processing chamber 201 through the nozzle 249a, and exhausted through the exhaust pipe 231. The HCDS gas is thereby supplied to the wafers 200. At the same time, N$_2$ gas into is supplied to the gas supply pipe 232c by opening the valve 243c. The N$_2$ gas having the flow rate thereof adjusted by the MFC 241c is supplied to the processing chamber 201 through the gas supply pipe 232a and the nozzle 249a and is exhausted through the exhaust pipe 231. To prevent the HCDS gas from entering the nozzles 249b and 249e, N$_2$ gas is supplied into the gas supply pipes 232d and 232f by opening the valves 243d and 243f. The N$_2$ gas is supplied into the processing chamber 201 via the gas supply pipes 232b and 232e, the nozzles 249b and 249e and the purge space 201a and is exhausted through the exhaust pipe 231.

At this time, the inner pressure of the processing chamber 201, for example, ranges from 1 Pa to 4000 Pa, preferably from 67 Pa to 2666 Pa, and more preferably from 133 Pa to 1333 Pa. The flow rate of the supplied HCDS gas, for example, ranges from 1 sccm to 2000 sccm, and preferably from 10 sccm to 1000 sccm. The flow rates of the N$_2$ gas supplied through the gas supply pipes, for example, range from 100 sccm to 10000 sccm, respectively. The supply time of the HCDS gas, for example, ranges from 1 second to 120 seconds, preferably from 1 second to 60 seconds. The heater 207 is controlled to heat the wafers 200 to a temperature, for example, ranging from 250° C. to 700° C., preferably from 300° C. to 650° C., more preferably from 350° C. to 600° C.

When the temperature of the wafers 200 is less than 250° C., it is difficult for the HCDS to be chemically adsorbed to the wafer 200, and a practical film forming rate may not be obtained. By setting the temperature of the wafer 200 at 250° C. or higher, the above disadvantages may be overcome. By setting the temperature of the wafer 200 at 300° C. or higher or more preferably to 350° C. or higher, the HCDS gas may be sufficiently adsorbed to the wafer 200, and a sufficient deposition rate may be obtained.

When the temperature of the wafer 200 exceeds 700° C., it is disadvantageous that the thickness uniformity of the film is degraded and the thickness uniformity of the film is difficult to control due to excessive gas phase reaction. By controlling the temperature of the wafer 200 to 700° C. or lower and generating an appropriate vapor phase reaction, degradation of the thickness uniformity of the film may be suppressed and the thickness uniformity of the film may be controlled. Particularly, by setting the temperature of the wafer 200 to 650° C. or lower or more preferably to 600° C. or lower, the surface reaction becomes more dominant than the gas phase reaction, which results in uniform thickness and facilitation of controlling the thickness uniformity of the film.

Accordingly, the temperature of the wafer 200 preferably ranges from 250° C. to 700° C., more preferably from 300° C. to 650° C., and still more preferably from 350° C. to 600° C.

By supplying the HCDS gas to the wafer 200 under the conditions described above, a silicon-containing layer including chlorine (Cl) having a thickness ranging from less than one atomic layer to several atomic layers (from less than one molecule layer to several atomic layers) is deposited on the top surface of the wafer 200 as a first layer (initial layer). The silicon-containing layer including chlorine may be a silicon (Si) layer including chlorine, an adsorption layer of HCDS, or a layer containing both.

After the first layer is formed, the supply of the HCDS gas is stopped by closing the valve 243a. With the APC valve 244 open, the inner atmosphere of the processing chamber 201 is exhausted by the vacuum pump 246. Accordingly, the HCDS gas remaining in the processing chamber 201 or contributed to the formation of the first layer is removed from the processing chamber 201. At this time, $N_2$ gas is continuously supplied into the processing chamber 201 by maintaining the valves 243c, 243d and 243f open. The $N_2$ gas acts as a purge gas.

In addition to the HCDS gas, inorganic source gases such as dichlorosilane ($SiH_2Cl_2$ abbreviated as DCS) gas, monochlorosilane ($SiH_3Cl$ abbreviated as MCS) gas, tetrachlorosilane ($SiCl_4$ abbreviated as STC) gas, trichlorosilane ($SiHCl_3$ abbreviated as TCS) gas, trisilane ($Si_3H_8$ abbreviated as TS) gas, disilane ($Si_2H_6$, DS) gas, monosilane ($SiH_4$ abbreviated as MS) gas and organic source gases such as tetrakis(dimethylamido)silane ($Si[N(CH_3)_2]_4$ abbreviated as 4DMAS) gas, trisdimethylaminosilane ($Si[N(CH_3)_2]_3H$ abbreviated as 3DMAS) gas, bis(diethylamino)silane ($Si[N(C_2H_5)_2]_2H_2$, abbreviated as BDEAS) gas, bis(tertiary-butylamino)silane ($SiH_2[NH(C_4H_9)]_2$ abbreviated as BTBAS) gas and diisopropylamino silane ($SiH_3N[CH(CH_3)_2]_2$ abbreviated as DIPAS) gas may be used as the source gas.

As an inert gas, rare gases such as Ar gas, He gas, Ne gas and Xe gas may be used as well as $N_2$ gas.

<Step 2>

After Step 1 is completed, $O_2$ gas and $H_2$ gas are supplied separately into the processing chamber 201, and these gases are mixed and react with each other in the processing chamber 201.

In the step 2, the opening and closing operations of the valves 243b through 243d and 243f are the same as those of the valves 243a, 243c, 243d and 243f in the step 1. The $O_2$ gas having the flow rate thereof adjusted by the MFC 241b is supplied into the processing chamber 201 through the nozzle 249b. At the same time, the $H_2$ gas is supplied into the gas supply pipe 232a by opening the valve 243a. The $H_2$ gas having the flow rate thereof adjusted by the MFC 241a is supplied into the processing chamber 201 via the nozzle 249a. The $O_2$ gas and the $H_2$ gas are mixed in the processing chamber 201 for the first time to react with each other, and then exhausted through the exhaust pipe 231.

At this time, the inner pressure of the processing chamber 201 is lower than the atmospheric pressure, for example, 1 Pa to 1333 Pa. The flow rate of the supplied $O_2$ gas, for example, ranges from 1000 sccm to 10000 sccm. The flow rate of the supplied $H_2$ gas, for example, ranges from 1000 sccm to 10000 sccm. The supply time of the $O_2$ gas and the $H_2$ gas, for example, ranges from 1 second to 120 seconds. Other process conditions may be the same as those in the step 1.

By supplying the $O_2$ gas and the $H_2$ gas into the processing chamber 201 under the above-described conditions, the $O_2$ gas and the $H_2$ gas are thermally activated (excited) and react with each other under a heated reduced-pressure and non-plasma atmosphere. Moisture ($H_2O$) free oxidizing species containing oxygen such as atomic oxygen (O) is thereby generated. The oxidation process for the first layer formed on the wafer 200 in the step 1 is mainly performed by the oxidizing species. The energy of the oxidizing species is higher than the bonding energy of bonds such as Si—Cl and Si—H contained in the first layer. Thus, by transferring the energy of the oxidizing species to the first layer, bonds such as Si—Cl and Si—H contained in the first layer are broken. Hydrogen and chlorine from Si—Cl bond and Si—H bond are removed from the film and discharged as $Cl_2$ and HCl or the like. The silicon separated from hydrogen and chlorine bonds with oxygen contained in the oxidizing species to form Si—O bonds. Accordingly, the first layer is changed (modified) to a second layer, i.e., an $SiO_2$ layer with a lower amount of impurities such as chlorine. According to the oxidation process, the oxidizing power may be significantly improved as compared with the case where only $O_2$ gas is supplied or when water vapor ($H_2O$) is supplied. That is, by adding $H_2$ gas to the $O_2$ gas in a reduced pressure atmosphere, an effect of significantly improving the oxidizing power as compared with the case where only the $O_2$ gas is supplied or the $H_2O$ gas is supplied is obtained.

<Residual Gas Removal>

After the first layer is changed (modified) to the second layer (SiO layer), the valves 243b and 243a are closed to stop the supply of the $O_2$ gas and the $H_2$ gas. The $O_2$ gas or the $H_2$ gas or reaction by-products remaining in the processing chamber 201 are then removed from the processing chamber 201 according to the process sequence and under the process conditions same as those of the step 1.

As the gas containing oxygen, gases such as ozone ($O_3$) gas as well as the $O_2$ gas may be used. As the hydrogen-containing gas, gases such as deuterium ($D_2$) gas may be used as well as the $H_2$ gas. When an aminosilane source gas such as 4DMAS gas and 3DMAS gas is used as the source gas, $O_3$ gas used as the gas containing oxygen provides sufficient film-forming rate (substantially equal to the film-forming rate when using the hydrogen-containing gas) without using the hydrogen-containing gas. As the inert gas, various rare gases exemplified in the step 1 may be used as well as $N_2$ gas.

<Performing Predetermined Number of Times>

A $SiO_2$ film of a predetermined thickness may be formed on the wafer 200 by performing the cycle including the above-described steps 1 and 2 non-simultaneously, i.e. asynchronously a predetermined number of times (n times). The cycle is preferably repeated a plurality of times. That is, it is preferable that the cycle is repeated a plurality of times while maintaining the thickness of the second layer formed in each cycle smaller than the thickness of the desired film until the total thickness of the film formed by laminating the second layer reaches the desired thickness.

<Purge Step and Atmospheric Pressure Return Step>

When the film forming step is completed and a $SiO_2$ film having a predetermined thickness is formed, $N_2$ gas is supplied into the processing chamber 201 through the gas supply pipes 232c, 232d and 232f and exhausted through the exhaust pipe 231. The $N_2$ gas acts as a purge gas. The processing chamber 201 is purged by supplying $N_2$ gas. The gas or reaction by-products remaining in the processing chamber 201 are purged from the processing chamber 201 (purge step). Thereafter, the inner atmosphere of the processing chamber 201 is replaced with an inert gas (inert gas replacement step), and the inner pressure of the processing chamber 201 is returned to atmospheric pressure (atmospheric pressure return step).

<Boat Unloading Step and Wafer Discharging Step>

Thereafter, the seal cap 219 is lowered by the boat elevator 115 and the lower end of the manifold 209 is opened. The boat 217 supporting the processed the wafers 200 is unloaded from the reaction tube 203 through the lower end of the manifold 209 (boat unloading step). After the boat is unloaded, the lower end of the manifold 209 is sealed by the shutter (not shown) through an O-ring (not shown) (shutter closing step). The processed the wafers 200 are discharged from the boat 217 after the boat 217 is unloaded from the reaction tube 203 (wafer discharging step).

(3) Cleaning Process

When the film forming process described above is performed, a deposit including reaction by-products and a thin film such as a $SiO_2$ film is deposited on the surface of the member in the processing chamber 201 such as the inner wall of the processing chamber 201 (i.e., the inner wall of the reaction tube 203), the surface and the inner wall of the nozzles 249a and 249b, the surface of the cover 209a, the surface of the boat 217 and the surface of the manifold 209. That is, the deposit containing oxygen is adhered to and accumulated on the surface of the member in the heated processing chamber 201. SiO-based deposit such as a silicon-based deposit having silicon as a main component (deposited by the attachment of the HCDS to the inner wall of the nozzle 249a) and a SiOx film (formed by the reaction between the HCDS adhered to the nozzle 249a and $O_2$ gas entering the nozzle 249a) is adhered to the inner wall of the nozzle 249a. Therefore, when the amount of these deposits, that is, the accumulated film thickness, reaches a predetermined amount (thickness) before separation or dropping of the deposit occurs, a cleaning process is performed.

Figure 5:
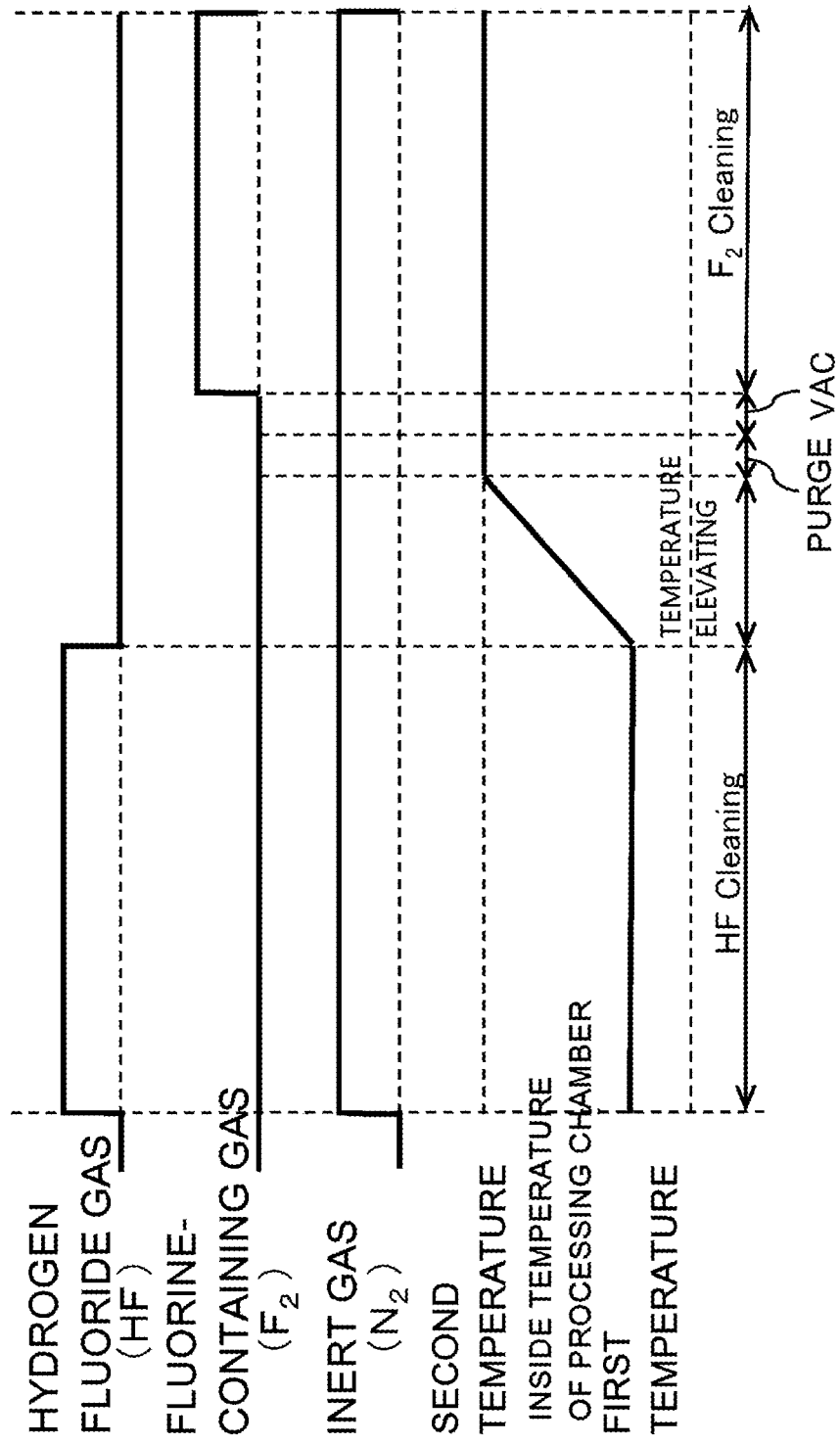
FIG. 5 illustrates a gas supply timing in a cleaning process according to the embodiment described herein.

In the cleaning process shown in FIG. 5, a HF cleaning step for supplying HF gas into the processing chamber (processing vessel) 201 heated to a first temperature, a temperature elevating step for raising the inner temperature of the processing chamber 201 to a second temperature higher than the first temperature, and a $F_2$ cleaning step for supplying $F_2$ gas to the processing chamber 201 to the processing chamber 201 heated to the second temperature. The $F_2$ gas is not activated at the first temperature but is activated at the second temperature.

One example of the cleaning process of the embodiment will be described below with reference to FIG. 5. Hereinafter, the controller 121 controls the operations of the components constituting the substrate processing apparatus.

<Boat Loading Step>

The lower end of the manifold 209 is opened by opening the shutter (not shown) by the shutter opening/closing mechanism 115s (shutter opening step). The empty boat 217, that is, the boat 217 not loaded with the wafers 200, is lifted by the boat elevator 115 and loaded into the processing chamber 201 (boat loading step). The seal cap 219 then seals the lower end of the manifold 209 via the O-ring 220b with the empty boat 217 loaded in the processing chamber 201.

<Pressure Adjusting Step and Temperature Adjusting Step>

The vacuum pump 246 exhausts the processing chamber 201 until the inner pressure of the processing chamber 201 reaches a predetermined pressure (pressure adjusting step). The vacuum pump 246 continues to operate at least until the cleaning process is completed. The heater 207 heats the processing chamber 201 until the inner temperature of the processing chamber 201 reaches the first temperature (temperature adjusting step). Next, the rotation of the boat 217 is started by the rotating mechanism 267. The heater 207 continues to heat the processing chamber 201 and the rotating mechanism 267 continues to rotate the boat 217 until at least the $F_2$ cleaning step is completed. However, while the heater 207 continues to heat the processing chamber 201, the rotating mechanism 267 may not rotate the boat 217.

<HF Cleaning Step>

In the HF cleaning step, after the process of forming a $SiO_2$ film on the wafers 200 is performed, at least HF gas is continuously supplied into the processing chamber 201 having the deposit containing the oxygen-containing film such as an $SiO_2$ film adhered thereto.

In the HF cleaning step, the opening and closing operations of the valves 243a, 243c, 243d and 243f are the same as those of the valves 243a, 243c, 243d and 243f in the step 1 of the film forming process. The HF gas having the flow rate thereof adjusted by the MFC 241a is supplied to the processing chamber 201 via the gas supply pipe 232a and the nozzle 249a. The HF gas is diluted in the gas supply pipe 232a by the $N_2$ gas supplied through the gas supply pipe 232c. The concentration of the HF gas supplied into the processing chamber 201 is thereby controlled. At the same time, the valves 243b and 243e are opened to supply the HF gas into the gas supply pipes 232b and 232e, and the HF gas may then be supplied into the processing chamber 201 through the nozzles 249b and 249e. Also, in the HF cleaning step, the $F_2$ gas is not supplied into the processing chamber 201.

At this time, the inner pressure of the processing chamber 201, for example, ranges from 6650 Pa to 26600 Pa (50 Torr to 200 Torr), preferably from 13300 Pa to 19950 Pa (100 Torr to 150 Torr). The flow rate of the supplied HF gas, for example, ranges from 1000 sccm to 8000 sccm, preferably from 2000 sccm to 8000 sccm. The time for supplying the HF gas into the processing chamber 201, for example, ranges from 60 seconds to 1800 seconds, preferably from 120 seconds to 1200 seconds. The heater 207 is controlled to heat the processing chamber 201 until the inner temperature (first temperature) of the processing chamber 201, for example, ranges from 30° C. (or under room temperature) to 100° C., preferably from 35° C. to 70° C., more preferably from 40° C. to 50° C.

The deposit may be etched with good controllability by setting the inner temperature of the processing chamber 201 to be 30° C. or higher.

When the inner temperature of the processing chamber 201 exceeds 100° C., it is difficult for the HF to be adsorbed on the surface of the member in the processing chamber 201, making it difficult to etch the deposit. By setting the inner temperature of the processing chamber 201 to be equal to or lower than 100° C., the above disadvantages may be overcome. By setting the inner temperature of the processing chamber 201 to be 70° C. or lower, more preferably 50° C. or lower, the etching reaction by the HF may reliably occur.

Accordingly, the inner temperature of the processing chamber 201 ranges from 30° C. to 100° C., preferably from 35° C. to 70° C., more preferably from 40° C. to 50° C.

The $F_2$ gas supplied into the processing chamber 201 is not activated at the first temperature in the $F_2$ cleaning step to be described later. "Not activated" refers to the $F_2$ gas being hardly activated such that the $F_2$ gas virtually not activated as well as the $F_2$ gas not being activated at all.

The HF gas supplied into the processing chamber 201 comes in contact with the surface of the member in the processing chamber 201, for example, the inner wall of the processing chamber 201 (i.e., the inner wall of the reaction tube 203), the surface of the nozzles 249a and 249b, the surface of the cover 209a, the surface of the boat 217 and the inner wall of the manifold 209 and the upper surface of the seal cap 219, while passing through the inside of the processing chamber 201 until exhausted through the exhaust pipe 231. At this time, the deposit containing the oxygen-containing film adhered to the member in the processing chamber 201 may be removed by thermochemical reactions. That is, the deposit may be removed by etching reaction between the HF and the deposit.

Compared to other cleaning gases such as $F_2$ gas, HF gas may etch oxide-based (SiO) deposits such as $SiO_2$ at a relatively low temperature (e.g., 30° C. to 100° C.). Therefore, by supplying the HF gas into the processing chamber 201 under the above-described conditions, the deposit adhered to the member in the lower region (the low temperature region) of the processing chamber 201 which is difficult to be heated by the heater 207 may be removed. The deposit including a sparse film such as SiOx adhered to the inner wall of the furnace opening (near the seal cap 219, the heat insulating plate 218 and the inlet, etc.) at the lower part of the processing vessel (processing chamber 201) may be removed.

The etching reaction by the HF gas does not occur at the members made of silicon carbide (SiC). Thus, for example, when the boat 217 is made of silicon carbide (SiC), the HF gas may remove the deposit adhered to the surface of the boat 217 without damaging the boat 217.

Thus, by supplying the HF gas into the processing chamber 201 having the deposit including $SiO_2$ film and sparse film such as SiOx, the etching of the deposit in the entire processing chamber 201 may be performed properly under non-plasma atmosphere.

However, a silicon-based deposit containing silicon as a main component adhered to the nozzle 249a is difficult to remove in the HF cleaning step. Therefore, even when the HF cleaning step is performed, the silicon-based deposit may remain in the nozzle 249a. A deposit remaining even after the HF cleaning step, such as a silicon-based deposit adhered to the nozzle 249a, may be removed by performing the $F_2$ cleaning step described below.

In the HF cleaning step, a hydrogen/fluorine-containing gas such as HF gas is preferably supplied in the processing chamber 201. The inventors of the present application have discovered that the etching reaction described above hardly occurs when the fluorine ($F_2$) gas or chlorine fluoride ($ClF_3$) gas is supplied instead of the HF gas in the processing chamber 201 in the HF cleaning step. While it is necessary to use a hydrogen/fluorine-containing gas such as HF gas to etch a deposit containing SiO as its main constituent, i.e. an oxygen-containing film, $F_2$ gas and $ClF_3$ gas are fluorine-based gas that does not contain hydrogen.

However, when the hydrogen/fluorine-containing gas such as HF gas is used to etch the deposit containing the oxygen-containing film, the oxygen contained in the deposit (SiO) bonds to the hydrogen contained in HF to produce moisture ($H_2O$) in the processing chamber 201. In addition, the silicon contained in the deposit bonds to the fluorine contained in HF to produce $SiF_4$ in the processing chamber 201. These products generated in the processing chamber 201 may be removed (exhausted) from the processing chamber 201 by performing a temperature elevating step and a purge step, which will be described later.

As the inert gas, various rare gases exemplified in the above-described film forming process may be used as well as $N_2$ gas.

<Temperature Elevating Step and Purge Step>

After the HF cleaning step is completed, the valves 243a and 243b are closed to stop the supply of the HF gas into the processing chamber 201. The heater 207 heats the processing chamber 201 until the inner temperature of the processing chamber 201 reaches the second temperature (for example, 250° C. to 450° C.) higher than the first temperature described above (temperature elevating step). That is, the inner temperature of the processing chamber 201 is raised to the processing temperature of the $F_2$ cleaning step, which will be described later.

In the temperature elevating step, when the inner temperature of the processing chamber 201 is raised to the processing temperature of the $F_2$ cleaning step, moisture and $SiF_4$ in the processing chamber 201 may be removed.

As described above, when the HF cleaning step is performed, substances such as moisture and $SiF_4$ are produced in the processing chamber 201. When the moisture coexists with the remaining HF gas in the processing chamber 201 due to the HF cleaning step, metal members in the processing chamber 201 is corroded or particles are generated. When the inside temperature of the processing chamber 201 is maintained at the first temperature (30° C. to 100° C.) as described above when the inside of the processing chamber 201 is exhausted after the HF cleaning step, the moisture ($H_2O$) cannot be removed sufficiently and efficiently. The first temperature is lower than the boiling point of water (100° C.). Even when only the moisture in the processing chamber 201, the moisture in the processing chamber 201 is likely to remain in a liquid state at the first temperature since the first temperature is lower than the boiling point of water. At the first temperature, the moisture is unlikely to self-evaporate, and even when some of the moisture evaporates, the moisture in the processing chamber 201 is likely to remain in a liquid state. In contrast, in accordance with the embodiment described above, the heater 207 heats the processing chamber 201 until the inner temperature of the processing chamber 201 reaches the second temperature higher than the first temperature after the HF cleaning step is completed. Therefore, the moisture present in the processing chamber 201 may be removed by evaporation.

However, moisture is likely to remain in the low temperature region. The temperature of the furnace opening (low temperature region) of the processing chamber 201 is lower than those of the wafers 200 when performing the film forming process in another region in the processing chamber 201, i.e. an upper region where the wafers 200 are arranged (hereinafter also referred to as a product region or a high temperature region) in the processing chamber 201. In this case, even when the above-described temperature elevating step or purge step is performed, the moisture may remain on the surface of the member in the low temperature region of the processing chamber 201 such as the inner wall of the furnace opening. The residual moisture may be discharged (removed) from the processing chamber 201 by performing the $F_2$ cleaning step described below.

In this embodiment, after the HF cleaning step is completed, $N_2$ gas is supplied into the processing chamber 201 (purge step) with the supply of the HF gas into the processing chamber 201 suspended.

In the purge step, with the APC valve 244 open, at least one of the valves 243c, 243d, 243f is opened (or maintained in the open state) $N_2$ gas is continuously supplied into the processing chamber 201. Thus, the moisture may be efficiently removed from the processing chamber 201. Residues such as the HF gas remaining in the processing chamber 201 and $SiF_4$ generated in the processing chamber 201 may also be removed from the processing chamber 201. When the purge of the processing chamber 201 is completed, the supply of the $N_2$ gas into the processing chamber 201 is stopped and the processing chamber 201 is vacuum-exhausted (VAC).

As the inert gas, various rare gases exemplified in the above-described film forming process may be used as well as $N_2$ gas.

<$F_2$ Cleaning Step>

When the temperature elevating step and the purge step are completed, at least the $F_2$ gas is continuously supplied into the processing chamber 201 heated to the second temperature.

The deposit remaining on the surface of the member in the processing chamber 201 and the silicon-based deposit adhered to the nozzle 249a that are not completely removed in the HF cleaning step and substances such as the moisture remaining in the low temperature region of the processing chamber 201 that are not completely removed in the temperature elevating step and the purge step may be removed by the $F_2$ cleaning step.

In the $F_2$ cleaning step, the opening and closing operations of the valves 243a, 243c, 243d and 243f are the same as those of the valves 243a, 243c, 243d and 243f in the step 1 of the film forming process. The $F_2$ gas having the flow rate thereof adjusted by the MFC 241a is supplied into the processing chamber 201 through the gas supply pipe 232a and the nozzle 249a. The $F_2$ gas is diluted in the gas supply pipe 232a by the $N_2$ gas supplied through the gas supply pipe 232c. The concentration of $F_2$ gas supplied into the processing chamber 201 may be thereby controlled. Also, in the $F_2$ cleaning step, the HF gas is not supplied into the processing chamber 201.

The $F_2$ gas supplied into the processing chamber 201 through the nozzle 249a is heated in the nozzle 249a or in the processing chamber 201 to be activated (excited) to a high energy state in which a chemical reaction is facilitated. That is, a large number of fluorine (F) in excited state (active species of fluorine in excited state) is generated.

At this time, the inner pressure of the processing chamber 201, for example, ranges from 6650 Pa to 26600 Pa (50 Torr to 200 Torr), and preferably from 13300 Pa to 19950 Pa (100 Torr to 150 Torr). The flow rate of the supplied $F_2$ gas, for example, ranges from 500 sccm to 5000 sccm, preferably from 1000 sccm to 4000 sccm. The temperature of the heater 207 is controlled such that the inner temperature of the processing chamber 201, for example, ranges from 250° C. to 450° C., preferably from 300° C. to 400° C. (second temperature). The other process conditions are the same as those of the HF cleaning step.

When the inner temperature of the processing chamber 201 is lower than 250° C., a chemical reaction hardly occurs since the $F_2$ gas is not activated. That is, a large number of $F_2$ molecules in a ground state are present such that the etching reaction hardly occurs. Thus, by setting the inner temperature of the processing chamber 201 at 250° C. or higher or more preferably 300° C. or higher, the etching reaction of the deposit is facilitated.

When the inner temperature of the processing chamber 201 exceeds 450° C., the etching reaction may occur excessively and the members in the processing chamber 201 may be damaged. By setting the inner temperature of the processing chamber 201 to 450° C. or lower, the etching reaction may be appropriately suppressed, thereby preventing the members in the processing chamber 201 from being damaged. By setting the inner temperature of the processing chamber 201 to be equal to or lower than 400° C., the etching reaction may be suppressed more appropriately, and the damage of the member in the processing chamber 201 may be reliably prevented.

Therefore, the inner temperature of the processing chamber 201 may be set to 250° C. or higher and 450° C. or lower, preferably 300° C. or higher and 400° C. or lower.

The $F_2$ gas is capable of removing deposits such as silicon, $Si_3N_4$ and $SiO_2$ (silicon-based, SiO-based deposits) at a temperature between 250° C. to 450° C. Therefore, by supplying the $F_2$ gas ($F_2$ gas diluted with $N_2$ gas) into the processing chamber 201 under the above-described conditions, the residual SiO-based deposit remaining on the surface of the member in the processing chamber 201 that are not completely removed in the HF cleaning step may be removed by thermochemical reaction.

By supplying the $F_2$ gas into the processing chamber 201 under the above-described conditions, the silicon-based deposit having silicon as a main component adhered to the nozzle 249a that is not completely removed in the HF cleaning step and the SiO-based deposit such as the SiOx film remaining in the nozzle 249a that is not completely removed in the HF cleaning step may be removed. The nozzle 249a is heated to the second temperature by the heater 207 heating the processing chamber 201 until the inner temperature of the processing chamber 201 reaches the second temperature. By supplying the $F_2$ gas into the nozzle 249a heated to the second temperature, the deposit adhered to the nozzle 249a may be removed by thermochemical reaction. That is, the deposit adhered to the inner wall of the nozzle 249a during the film forming process is etched by the $F_2$ gas supplied into the nozzle 249a heated to the second temperature, and removed from the nozzle 249a.

That is, by supplying $F_2$ gas into the processing chamber 201 under the above-described conditions, the $F_2$ gas is thermally activated (excited) into under a heated non-plasma atmosphere. Active species of fluorine in excited state is thereby generated. The cleaning process of the inside of the nozzle 249a or the inside of the processing chamber 201 is mainly performed by the active species. The $F_2$ gas supplied in the processing chamber 201 is activated at the second temperature. That is, the active species of fluorine in excited state is generated at the second temperature. At the second temperature, sufficient etching reaction occurs even when only the $F_2$ gas is used. The activation of the $F_2$ gas refers to not only the activation of all of the $F_2$ gas, but also refers to a partial activation of the $F_2$ gas substantially the same as the activation of the $F_2$ gas where all of the $F_2$ gas is activated.

Even when the temperature of the furnace opening in the processing chamber 201 is lower than the temperature of the product region in the processing chamber 201, the moisture in the low temperature region in the processing chamber 201 such as the inner wall of the furnace opening in the chamber 201 may be efficiently removed by supplying the $F_2$ gas into the processing chamber 201 under the above-described conditions. This is because the moisture remaining in the processing chamber 201 is converted to substances such as HF and $O_2$ which may be removed easily from the processing chamber 201 by the reaction between the $F_2$ gas supplied into the processing chamber 201 and the moisture remaining in the processing chamber 201 when the $F_2$ gas supplied into the processing chamber 201. By taking advantage of the above reaction, the moisture may be efficiently removed from the processing chamber 201. That is, the moisture remaining in the processing chamber 201 that is not completely removed the temperature elevating step and the purge step may be easily removed.

As the gas containing fluorine, fluorine-based gases such as a mixture gas of $ClF_3$ gas, nitrogen trifluoride ($NF_3$) gas, $F_2$ gas and HF gas, a mixture gas of $ClF_3$ gas and HF gas, a mixture gas of $NF_3$ gas and HF gas, a mixture gas of $F_2$ gas and $H_2$ gas, a mixture gas of $ClF_3$ gas and $H_2$ gas, a mixture gas of $NF_3$ gas and $H_2$ gas, a mixture gas of $F_2$ gas and NO gas and a mixture gas of $ClF_3$ gas and NO gas may be used as well as the $F_2$ gas.

As the inert gas, the above-described rare gases may be used as well as $N_2$ gas.

<Additional Purge Step and Atmospheric Pressure Return Step>

When the $F_2$ cleaning step is completed, the valve 243a is closed to stop the supply of the $F_2$ gas into the processing chamber 201. $N_2$ gas is continuously supplied into the processing chamber 201 through each of the gas supply pipes 232c, 232d and 232f and exhausted through the exhaust pipe 231. The $N_2$ gas acts as a purge gas. The processing chamber 201 is thereby purged (additional purge step). At this time, the purge of the processing chamber 201 may be intermittently performed by opening and closing operations of the valves 243c, 243d, and 232f repeatedly (cyclic purge step). Thereafter, the inner atmosphere of the processing chamber 201 is replaced with $N_2$ gas (inert gas replacement step), and the pressure in the processing chamber 201 returns to normal pressure (Atmospheric Pressure Return Step).

<Boat Unloading Step>

The boat elevator 115 lowers the seal cap 219 to open the lower end of the manifold 209 and the empty boat 217 is carried out of the reaction tube 203 through the lower end of the manifold 209 (boat unloading step). After the boat is unloaded, the shutter (not shown) is moved to seal the lower end opening of the manifold 209 via an O-ring (not shown). After these series of processes are completed, the above-described film forming process may be resumed.

(4) Effect According to the Present Embodiment

According to the present embodiment, at least one advantageous effect described below is provided.

(a) By performing the HF cleaning step after performing the film forming process for forming the SiO film on the wafers 200, the deposit adhered to the surface of the member in the processing chamber 201 may be removed. In particular, by performing the HF cleaning step, the deposit adhered to the surface of the member in the low temperature region of the processing chamber 201 such as the inner wall of the furnace opening at the bottom of the reaction tube 203 may be removed. This may improve the quality of the film forming process performed subsequently.

In contrast, when only the $F_2$ cleaning step is performed, it is difficult to remove the deposit adhered to the member in the low temperature region of the processing chamber 201. Even though the inner temperature of the processing chamber 201 (the product region of the processing chamber 201) is maintained at the second temperature in the $F_2$ cleaning step, the temperature of the furnace opening in the processing chamber 201 is, for example, about 100° C. to 200° C. Therefore, even when the $F_2$ gas is supplied into the processing chamber 201, an etching reaction hardly occurs in the furnace opening.

(b) By performing the temperature elevating step, the moisture in the processing chamber 201 in the HF cleaning step may be removed from the processing chamber 201. Accordingly, the metal member in the processing chamber 201 may be prevented from being corroded by the residual moisture, and the generation of particles in the processing chamber 201 due to the corrosion of the metal member may be prevented.

(c) By performing the $F_2$ cleaning step after performing the HF cleaning step, the deposit remaining on the surface of the member in the processing chamber 201, which is not completely removed in the HF cleaning step, may be easily removed. This may significantly improve the quality of the film forming process performed subsequently.

(d) The inside of the nozzle 249a may be cleaned by performing the $F_2$ cleaning step. That is, the silicon-based deposit attached in the nozzle 249a and the SiO-based deposit, which are not completely removed in the HF cleaning step, may be easily removed. As a result, the inside of the nozzle 249a may be cleaned without removing the nozzle 249a such that the time required for the cleaning process may be shortened. Therefore, the downtime of the substrate processing apparatus may be shortened. Further, since it is not necessary to separate the nozzle 249a, the exposure the processing vessel to open atmosphere in order to separate the nozzles 249a is not required. As a result, the atmosphere in the processing vessel may be maintained clean and the quality of the film forming process may be significantly improved.

(e) In addition, by performing the $F_2$ cleaning step after performing the temperature elevating step, the moisture remaining in the processing chamber 201, not which is not completely removed in the elevating step, may be easily removed. In particular, the moisture remaining in a thermally insulated region in the processing chamber 201 may be removed. As a result, the efficiency of removing moisture from the processing chamber 201 may be further increased.

(f) Since the etching of the deposit may be performed in a non-plasma environment, the configuration of the substrate processing apparatus may be simplified, and the manufacturing cost and maintenance cost of the substrate processing apparatus may be reduced. The damage to the members in the processing chamber 201 by plasma may be prevented.

(g) The same effects may be obtained even when a gas other than the HCDS gas is used as a source gas, a gas other than the $O_2$ gas which is the gas containing oxygen is used as a reactive gas, or a gas other than $H_2$ gas is used as the hydrogen-containing gas.

(5) The Modified Examples of the Cleaning Process

The cleaning process according to the present embodiment is not limited to the above-described embodiment, but may be modified as described in the following.

First Modified Example

For example, in the purge step described above, $F_2$ gas or alcohol may be supplied into the processing chamber 201. On the other hand, $F_2$ gas or alcohol may be supplied into the processing chamber 201 while starting the temperature elevating step. For example, methanol ($CH_3OH$) may be supplied. Preferably, $CH_3OH$ may be supplied in a gaseous state as an alcohol gas ($CH_3OH$ gas). Accordingly, the moisture in the processing chamber 201 may be more effectively removed in the HF cleaning step.

Second Modified Example

By allowing the HCDS gas to enter the nozzle 249b in the film forming process, the deposit may adhere to the inner wall of the nozzle 249b. Thus, for example, $F_2$ gas may be supplied into the processing chamber 201 through a nozzle 249b in the $F_2$ cleaning step. Accordingly, the inside of the nozzle 249b may be cleaned in the $F_2$ cleaning step.

In addition, for example, in the $F_2$ cleaning step, $F_2$ gas may be supplied into the processing chamber 201 through at least one of the nozzles 249b and 249e as well as the nozzle 249a. That is, in the $F_2$ cleaning step, the nozzles 249b and 249e may be cleaned together with the nozzles 249a. In this case, for example, the time period $T_1$ during which $F_2$ gas is supplied into the processing chamber 201 through the nozzle 249a may be the same as the time period $T_2$ during which $F_2$ gas is supplied into the processing chamber 201 through the nozzles 249b and 249e ($T_1=T_2$). For example, since the amount of the deposit adhered to the inner walls of the nozzles 249b and 249e may be less than that of the deposit adhered to the inner walls of the nozzle 249a, the time period $T_2$ may be shorter than the time period $T_1$ ($T_2<T_1$). The $F_2$ gas may be supplied into the processing chamber 201 through the nozzles 249b and 249e only during one of first one third portion, second one third portion and third one third portion of the time period $T_1$ during which the $F_2$ gas is supplied into the processing chamber 201 through the nozzle 249a.

Third Modified Example

In the above-described embodiment, the cover 209a is provided. However, the cover 209a may not be provided. In addition, for example, a ring-shaped nozzle ($N_2$ purge ring) may be provided instead of the nozzle 249e. The $N_2$ purge ring is configured to supply $N_2$ gas around the furnace opening in the processing chamber 201. When the $N_2$ purge ring is installed instead of the nozzle 249e, $F_2$ gas ($F_2$ gas diluted with $N_2$ gas) may be supplied into the processing chamber 201 through the $N_2$ purge ring in the $F_2$ cleaning step.

Fourth Modified Example

In the HF cleaning step, for example, HF gas may be supplied into the processing chamber 201 while the empty boat 217 is accommodated in the processing chamber 201. In the $F_2$ cleaning step, $F_2$ gas may be supplied into the processing chamber 201 without the empty boat 217 loaded in the processing chamber 201. As a result, the boat 217 may be prevented from being damaged by the $F_2$ gas. For example, at the temperature of 400° C., the rate of etching a boat made of silicon carbide (SiC) by $F_2$ is about three to five times the rate of etching a boat made of quartz by $F_2$. Thus, the boat 217 made of silicon carbide may be damaged when the $F_2$ cleaning step is performed with the boat 217 loaded in the processing chamber 201 heated to the second temperature. In contrast, the boat 217 may be prevented from being damaged by unloading the boat 217 from the processing chamber 201 in the $F_2$ cleaning step.

Further, by performing the $F_2$ cleaning step with the lower end of the manifold 209 sealed by the shutter (not shown), the $F_2$ cleaning step may be performed without separating the boat 217 from the seal cap 219. As a result, the overall cleaning process time may be shortened, thus also reducing the downtime of the substrate processing apparatus. It is possible to prevent the boat 217 from being damaged or generating particles.

Further, in the fourth modified example, the temperature elevating step may be started after the boat unloading step and the shutter closing step are completed, or the temperature elevating step may be started when the boat unloading starts. In addition, the boat unloading step may be started after the temperature elevating step is completed.

Fifth Modified Example

Similar to the cleaning sequence (i.e., the first modified example of gas supply timing) shown in FIG. 6A, the HF gas may be intermittently supplied into the processing chamber 201 in the HF cleaning step. The fifth modified example may provide the same effect as the cleaning sequence shown in FIG. 5. Further, by intermittently supplying the HF gas, the amount of moisture or $SiF_4$ in the processing chamber 201 may be appropriately controlled such that an environment where an etching reaction is likely to occur may be provided. By intermittently supplying the HF gas, the inner pressure of the processing chamber 201 may fluctuate. As the inner pressure of the processing chamber 201 fluctuates, the deposit may be subjected to a shock. Therefore, cracks or peeling is generated in the deposit, and the etching of the deposit may be more efficiently performed. The intermittent supply of the HF gas may cause fluctuation in the flow rate thereof in the processing chamber 201. As a result, the HF gas may be supplied to the entire interior of the processing chamber 201. By intermittently supplying the HF gas, the amount of the HF gas used may be appropriately controlled, thereby reducing the cost of the cleaning process.

Sixth Modified Example

Similar to the cleaning sequence shown in FIG. 6B (i.e., the second modified example of gas supply timing), $F_2$ gas may be supplied intermittently in the $F_2$ cleaning step. The sixth modified example may provide the same effect as the cleaning sequence shown in FIG. 5. Further, by varying the inner pressure of the processing chamber 201, the etching of the deposit may be performed efficiently. Also, by generating fluctuation in the flow rate of the $F_2$ gas in the processing chamber 201, the $F_2$ gas may be reliably supplied to the entire interior of the processing chamber 201. The amount of $F_2$ gas used may be appropriately controlled, thereby reducing the cost of the cleaning process.

Seventh Modified Example

Similar to the cleaning sequence shown in FIG. 6C (i.e., the third modified example of gas supply timing), HF gas may be intermittently supplied into the processing chamber 201 in the HF cleaning step and $F_2$ gas may be supplied intermittently in the $F_2$ cleaning step. The seventh modified example may be provide the same effect as the cleaning sequence shown in FIG. 5 or the above-described fifth modified example or sixth modified example.

Eighth Modified Example

Similar to the cleaning sequence shown in FIG. 6D (i.e., the fourth modified example of gas supply timing), both of the flow rate of the HF gas supplied into the processing chamber 201 in the HF cleaning step and the flow rate of the F$_2$ gas supplied into the processing chamber 201 in the F$_2$ cleaning step may be continuously varied (increased or decreased). Alternately, only one of the flow rate of the HF gas supplied into the processing chamber 201 in the HF cleaning step and the flow rate of the F$_2$ gas supplied into the processing chamber 201 in the F$_2$ cleaning step may be continuously varied. The eighth modified example may provide the same effect as the cleaning sequence shown in FIG. 5 or the above-described fifth modified example or sixth modified example.

Other Embodiments

The embodiments of the technique have been specifically described above. However, the above-described technique is not limited to the embodiments described above, and may be variously modified without departing from the scope thereof.

In accordance with the above-described embodiment, the HCDS gas, O$_2$ gas and H$_2$ gas are employed to form the SiO film on the wafers 200 under high temperature conditions. However, the technique is not limited to the above-described embodiment. For example, the technique may be applied to other examples such as forming SiO film on wafer 200 under intermediate temperature condition using an aminosilane source gas such as 3DMAS gas and BTBAS gas or under intermediate temperature condition using an amine catalyst such as pyridine (C$_5$H$_5$N). The technique may be applied to other examples such as forming SiO film on wafer 200 under low temperature condition using plasma-excited O$_2$ gas and an aminosilane source gas such as BTBAS gas. That is, the above-described technique may be preferably applied to the cleaning process of a processing chamber where SiO film is formed on the wafer 200 by the film forming sequence shown below:

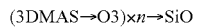
(3DMAS→O3)×n→SiO

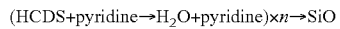
(HCDS+pyridine→H$_2$O+pyridine)×n→SiO

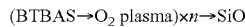
(BTBAS→O$_2$ plasma)×n→SiO

In addition, the above-described technique may be applied to the formation of silicon-based films such as a silicon oxycarbonitride film (SiOCN film), a silicon oxycarbide film (SiOC film), a silicon oxynitride film (SiON film) as well as to the formation of the SiO film on the wafer 200. That is, the above-described technique may be preferably applied to the cleaning process of a processing chamber where silicon-based films are formed as well as SiO film is formed on the wafers 200.

In addition, the above-described technique may be applied to the formation of an oxide film containing a metal element on the wafers 200 as well as the formation of the silicon-based oxide films. That is, the above-described technique may be preferably applied to the cleaning process of a processing chamber where a metal oxide film is formed on the wafers 200 as well as a silicon-based oxide films are formed on the wafers 200.

In addition, the above-described technique may be applied to cleaning process of the processing chamber to remove a deposit including a metal-based oxide film and semiconductor-based oxide film such as silicon-based oxide films. In this case, the process sequence and process condition of the cleaning process may be the same as those of the above-described embodiment, and effects same as the above-described embodiment and modified examples may be provided.

The recipe (program for storing information such as process sequence and process condition) used for substrate processing is prepared individually according to the processing contents such as the type of film to be formed, composition ratio, quality, thickness, process sequence and process condition and is stored in the memory device 121c via a telecommunication line or the external memory device 123. At the beginning of the substrate processing, the CPU 121a may select a recipe suitable for processing from a plurality of recipes stored in the memory device 121c. As a result, different types of films having various composition ratio, quality, and thickness may be formed with excellent reproducibility even when only a single substrate processing apparatus is used. In addition, since burden on the operator such as inputting information such as process sequence and process condition is reduced, the substrate processing may be started promptly while preventing operating mistakes by the operator.

The above-described recipe may be prepared, for example, by replacing an existing recipe already installed in the substrate processing apparatus as well as by creating a new recipe. In the case of replacing the existing recipe, the replacement recipe may be installed in the substrate processing apparatus via the telecommunication line or the recording medium storing the replacement recipe. The operator may directly modify the existing recipe already installed in the substrate processing apparatus by operating the input/output device 122 provided in the substrate processing apparatus.

In accordance with the above-described embodiment, the film is formed using a batch substrate processing apparatus that processes a plurality of substrates at one time. The technique described herein is not limited to the above-described embodiments, and may be applied to a single wafer substrate processing apparatus that processes one substrate at a time to form a film. In accordance with the above-described embodiment, the film is formed using substrate processing apparatus including a hot-wall type processing furnace. The technique described herein is not limited to the above-described embodiments, but may also be preferably applied to the formation of film using a substrate processing apparatus including a cold-wall type processing furnace. Even when the substrate processing apparatus including the cold-wall type processing furnace is used, the process sequence and the process condition may be the same as those of the above-described embodiment.

For example, the above-described technique may be preferably applied to the formation of film using a substrate processing apparatus having the processing furnace 302 shown in FIG. 8A. The processing furnace 302 includes a processing vessel 303 including a processing chamber 301, a showerhead 303s as a gas supply unit for showering a gas into the processing chamber 301, a substrate support 317 for supporting one or a plurality of wafers 200 in horizontally orientation, a rotation shaft 355 for supporting the substrate support 317 from therebelow and a heater 307 provided in the substrate support 317. Gas supply ports 332a and 332b are connected to the inlet (gas introduction port) of the showerhead 303s. Gas supply systems such as the source gas supply system, the hydrogen-containing gas supply system, the hydrogen/fluorine-containing gas supply system and the fluorine-containing gas supply system of the above-described embodiment are connected to the gas supply port 332a. Gas supply system such as the oxidizing gas supply system, the hydrogen/fluorine-containing gas supply system and the fluorine-containing gas supply system of the above-described embodiment is connected to the gas supply port 332b. A gas dispersion plate (not shown) configured to shower the gas into the processing chamber 301 is installed at an outlet (gas supply port) of the showerhead 303s. The showerhead 303s is installed to face the surface of the wafer 200 loaded in the processing chamber 301. An exhaust port 331 for exhausting the inside atmosphere of the processing chamber 301 is installed in the processing vessel 303. An exhaust system such as the exhaust system of the above-described embodiment is connected to the exhaust port 331.

The above-described technique may be preferably applied to the formation of film using a substrate processing apparatus having a processing furnace 402 shown in FIG. 8B. The processing furnace 402 includes a processing vessel 403 having a processing chamber 401, a substrate support 417 for supporting one or a plurality of the wafers 200 in horizontal orientation, a rotation shaft 455 supporting the substrate support 417 from therebelow, a lamp heater 407 for irradiating light toward the wafer 200 in the processing vessel 403 and a quartz window 403w for transmitting the light from the lamp heater 407. Gas supply ports 432a and 432b are connected to the processing vessel 403. Gas supply systems such as the source gas supply system, the hydrogen-containing gas supply system, the hydrogen/fluorine-containing gas supply system and the fluorine-containing gas supply system of the above-described embodiment is connected to the gas supply port 432a. Gas supply systems such as the as-oxidizing gas supply system, the hydrogen/fluorine-containing gas supply system and the fluorine-containing gas supply system of the above-described embodiment are connected to the gas supply ports 432b. The gas supply ports 432a and 432b are respectively installed at one side of the edge of the wafer 200 loaded in the processing chamber 401, i.e., at a position not facing the surface of the wafer 200 loaded in the processing chamber 401. An exhaust port 431 for exhausting the inside atmosphere of the processing chamber 401 is installed in the processing vessel 403. An exhaust system such as the exhaust system of the above-described embodiment is connected to the exhaust port 431.

A film forming process or a cleaning process may be performed according to the process sequence and process condition same as those of the above-described embodiment or modified example using substrate processing apparatus shown in FIGS. 8A and 8B. The effects the same as those of above-described embodiments or modified examples may be provided.

The above-described embodiments and modified examples may be used in combinations. The process sequence and the process condition of the combinations may be the same as those of the process sequence and process condition of the above-described embodiment.

EXAMPLES

The following examples illustrate the effects of the above-described embodiment or modified examples.

In the example, a film forming process for forming a SiO film on a wafer wherein the film forming sequence shown in FIG. 4 is performed using a substrate processing apparatus of the above-described embodiment. The HCDS gas is used as a source gas, $O_2$ gas is used as a gas containing oxygen, and $H_2$ gas is used as a hydrogen-containing gas. The process condition of the film forming process is same as that of the above-described embodiment. Thereafter, a HF cleaning step ("HF Cleaning" in FIG. 7A), a temperature elevating step "Heating" in FIG. 7A) and an $F_2$ cleaning step ("$F_2$ Cleaning" in FIG. 7A) are performed as the cleaning sequence shown in FIG. 5. The other process conditions are the same as those of the above-described embodiment. Thereafter, the inside of the processing chamber is purged ("VAC"/"$N_2$ PRG"/"VAC" in FIG. 7A).

In a comparative example, a film forming process for forming a SiO film on wafer wherein the film forming sequence shown in FIG. 4 is performed using a substrate processing apparatus of the above-described embodiment. The process sequence and process condition are same as those of the example. Thereafter, the $F_2$ cleaning step ("$F_2$ Cleaning" in FIG. 7B), a cooling step ("Cooling" in FIG. 7B) wherein the inner temperature of the processing chamber is lowered to the first temperature (ranging from 30° C. to 100° C.) which is lower than the second temperature (ranging from 250° C. to 450° C.), and the HF cleaning step ("HF Cleaning" in FIG. 7B) are performed. Thereafter, after removing the moisture from the processing chamber by raising the inner temperature of the processing chamber to the second temperature ("Heating" in FIG. 7B) while evacuating the inner atmosphere of the processing chamber is performed, the inside of the processing chamber is purged ("VAC"/"$N_2$ PRG"/"VAC" in FIG. 7B). The process conditions of the $F_2$ cleaning step and the HF cleaning step are the same as those of the above-described embodiment and the example.

FIG. 7A is a diagram showing the progress of the cleaning and the purge of the processing chamber in the example, and FIG. 7B is a diagram showing the progress of the cleaning and the purge of the processing chamber in the comparative example. FIGS. 7A and 7B, the abscissa represents elapsed time, and the ordinate represents the inner temperature of the processing chamber. In FIGS. 7A and 7B, the film forming process is not shown.

As shown in FIGS. 7A and 7B, according to the example, it may be confirmed that the time required for the entire cleaning process may be shorter compared to the comparative example. That is, in the example, by performing the $F_2$ cleaning step after performing the HF cleaning step, only heating for raising the inner temperature of the processing chamber is required. However, in the comparative example, since the HF cleaning step is performed after the $F_2$ cleaning step, both heating and cooling for raising and lowering the inner temperature of the processing chamber are required.

In the comparative example, the inner temperature of the processing chamber is lowered. Cooling takes longer than heating. For example, it takes about 5 hours for the inner temperature of the processing chamber to cools down to the first temperature from the second temperature. As a result, according to the example where cooling is not necessary, the time required for the entire cleaning process may be shorter compared to the comparative example.

Also in the example, the moisture is removed by the temperature elevating step and by the $F_2$ gas in the $F_2$ cleaning step. Contrarily, in the comparative example, the moisture is removed only by raising the temperature in the moisture removing step. Thus, as for the efficiency of removing moisture, the example provides higher efficiency than the comparative example. According to example, the entire cleaning process may be shortened. Also, according to the example, the corrosion of the metal members in the processing chamber may be more reliably suppressed compared to the comparative example.

Also, according to the example, it is confirmed that the deposit in the processing chamber may be reliably removed and the quality of the subsequent film forming process may be further improved compared to the comparative example. According to the example, after the HF cleaning step is performed at a lower temperature (the first temperature), the $F_2$ cleaning step is performed at high temperature (the second temperature). In contrast, according to the comparative example, the HF cleaning step is performed at a low temperature after the $F_2$ cleaning step is performed at a high temperature. Therefore, deposits in the processing chamber are susceptible to modification. For example, a sparse SiOx film adhered to a portion such as the inner wall of the furnace opening may be annealed to a dense film. Also, for example, the deposit such as a SiOx film may be modified to a SiOF film by the $F_2$ gas remaining in the processing chamber. Such dense film or SiOF film is difficult to be etched by HF gas. As a result, deposits may easily remain in the processing chamber. According to the example, the SiOx film adhered to the inner wall of the furnace opening is first removed by the HF cleaning. Therefore, even when the inside of the processing chamber is heated to the high temperature in the $F_2$ cleaning performed after the HF cleaning, the deposit does not remain contrary to the comparative example. Therefore, cleaning efficiency may be improved according to the example.

According to the technique described herein, cleaning efficiency may be improved after the film forming process is performed.

What is claimed is:

1. A method of cleaning a processing chamber after a formation of a film on a substrate, the method comprising:
   (a) supplying hydrogen fluoride gas into the processing chamber heated to a first temperature ranging from 30° C. to 100° C.;
   (b) elevating an inner temperature of the processing chamber to a second temperature ranging from 250° C. to 450° C.; and
   (c) supplying fluorine gas into the processing chamber heated to the second temperature,
   wherein the fluorine gas is not activated at the first temperature, and the fluorine gas is activated at the second temperature.

2. The method of claim 1, wherein a deposit adhered to a furnace opening at a lower portion of a processing vessel defining the processing chamber is removed in (a), and deposits adhered to an inside of a nozzle and an inner wall the processing chamber generated during the formation of the film are removed in (c).

3. The method of claim 1, wherein the fluorine gas is supplied into the processing chamber in (b).

4. The method of claim 1, wherein alcohol is supplied into the processing chamber in (b).

5. The method of claim 2, wherein (c) comprises supplying the fluorine gas to remove moisture present at the furnace opening generated while performing (a).

6. The method of claim 2, wherein (c) comprises supplying the fluorine gas into the processing chamber through a nozzle configured to supply during the formation of the film a source gas.

7. The method of claim 6, wherein (c) comprises supplying the fluorine gas into the processing chamber through a short nozzle disposed at the furnace opening.

8. The method of claim 6, wherein (c) comprises supplying the fluorine gas into the processing chamber through a nozzle configured to supply during the formation of the film a reactive gas.

9. The method of claim 1, wherein (a) comprises supplying the hydrogen fluoride gas into the processing chamber with a substrate retainer configured to support the substrate loaded in the processing chamber, and (c) comprises supplying the fluorine gas into the processing chamber with the substrate retainer unloaded from the processing chamber.

10. The method of claim 9, wherein the substrate retainer is made of silicon carbide.

11. The method of claim 1, wherein (a) comprises intermittently supplying the hydrogen fluoride gas into the processing chamber.

12. The method of claim 11, wherein (c) comprises intermittently supplying the fluorine gas into the processing chamber.

13. The method of claim 1, wherein at least one of a flow rate of the hydrogen fluoride gas supplied into the processing chamber in (a) and a flow rate of the fluorine gas supplied into the processing chamber in (c) are continuously varied.

14. The method of claim 13, wherein both of the flow rate of the hydrogen fluoride gas supplied into the processing chamber in (a) and the flow rate of the fluorine gas supplied into the processing chamber in (c) are continuously varied.

15. The method of claim 1, wherein the film formed on the substrate is a silicon oxide film.

16. The method of claim 1, wherein (c) is performed without supplying the hydrogen fluoride gas.

17. A method of manufacturing a semiconductor device, comprising:
   (a) forming a film on a substrate in a processing chamber; and
   (b) cleaning an inside of the processing chamber after performing (a), wherein (b) comprises:
      (b-1) supplying hydrogen fluoride gas into the processing chamber heated to a first temperature ranging from 30° C. to 100° C.;
      (b-2) elevating an inner temperature of the processing chamber to a second temperature higher than the first temperature ranging from 250° C. to 450° C.; and
      (b-3) supplying fluorine gas into the processing chamber heated to the second temperature,
      wherein the fluorine gas is not activated at the first temperature, and the fluorine gas is activated at the second temperature.

* * * * *